United States Patent
Kimura et al.

[11] Patent Number: 6,147,001
[45] Date of Patent: Nov. 14, 2000

[54] METHOD OF MANUFACTURING SEMICONDUCTOR INTEGRATED CIRCUIT DEVICE

[75] Inventors: Takeshi Kimura, Higashimurayama; Hidefumi Ito, Tokorozawa; Hiroyuki Kojima, Kawasaki; Nobuhiro Konishi, Ome; Yuuichirou Taguma, Hidaka; Shinichiro Mitani, Tokorozawa, all of Japan

[73] Assignee: Hitachi, Ltd., Tokyo, Japan

[21] Appl. No.: 08/845,398

[22] Filed: Apr. 24, 1997

[30] Foreign Application Priority Data

Apr. 25, 1996 [JP] Japan ..................... 8-129135

[51] Int. Cl.$^7$ ................................. H01L 21/302
[52] U.S. Cl. ................. 438/692; 438/648; 438/685; 438/697; 438/699
[58] Field of Search .................. 438/238, 256, 438/257, 259, 692, 697, 699, 648, 685

[56] References Cited

U.S. PATENT DOCUMENTS

| | | | |
|---|---|---|---|
| 5,604,158 | 2/1997 | Cadien et al. | 438/683 |
| 5,772,780 | 6/1998 | Homma et al. | 134/7 |
| 5,895,270 | 4/1999 | Hempel, Jr. | 438/692 |

FOREIGN PATENT DOCUMENTS

| | | |
|---|---|---|
| 5-69310 | 3/1993 | Japan . |
| 5-74749 | 3/1993 | Japan . |
| 6-15563 | 1/1994 | Japan . |
| 7-112364 | 2/1995 | Japan . |
| 7-164308 | 6/1995 | Japan . |

*Primary Examiner*—David Nelms
*Assistant Examiner*—Renee R. Berry
*Attorney, Agent, or Firm*—Beall Law Offices

[57] ABSTRACT

A method of manufacturing a semiconductor integrated circuit wherein a patterned wafer polishing machine for uniformly polishing a surface by chemical mechanical polishing is utilized which is provided with a head for holding a wafer and rubbing it on an abrasive surface. A pressure plate provided with vents is held by the head body which is provided with a gas inlet and an elastic film for sealing vents is provided on the end face on the side reverse to the gas inlet side of the pressure plate. A patterned wafer is held by the head as the wafer, pressed by action of the pressure of air from the gas inlet via the elastic film is pressed mechanically by the pressure plate. The polishing surface which is a principal plane on the patterned side of the wafer is mechanochemically polished by the abrasive surface.

30 Claims, 15 Drawing Sheets

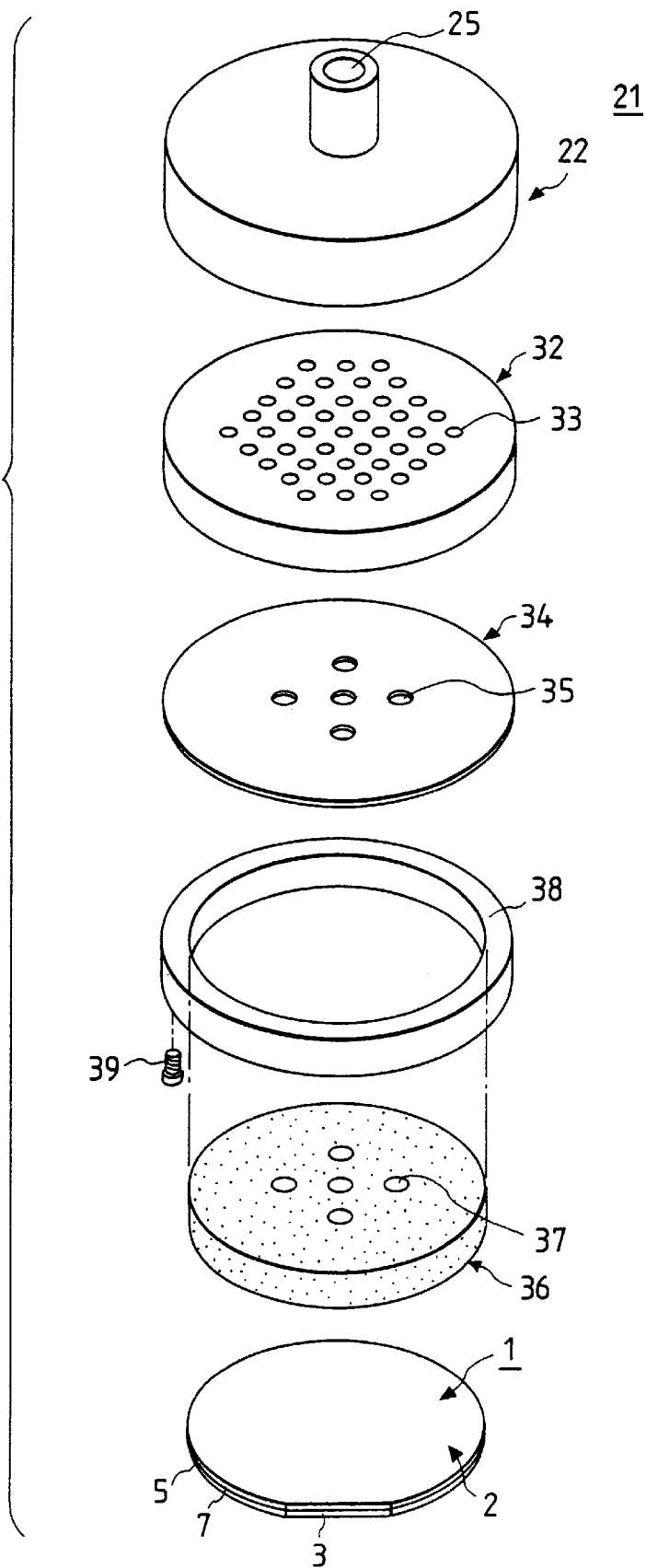

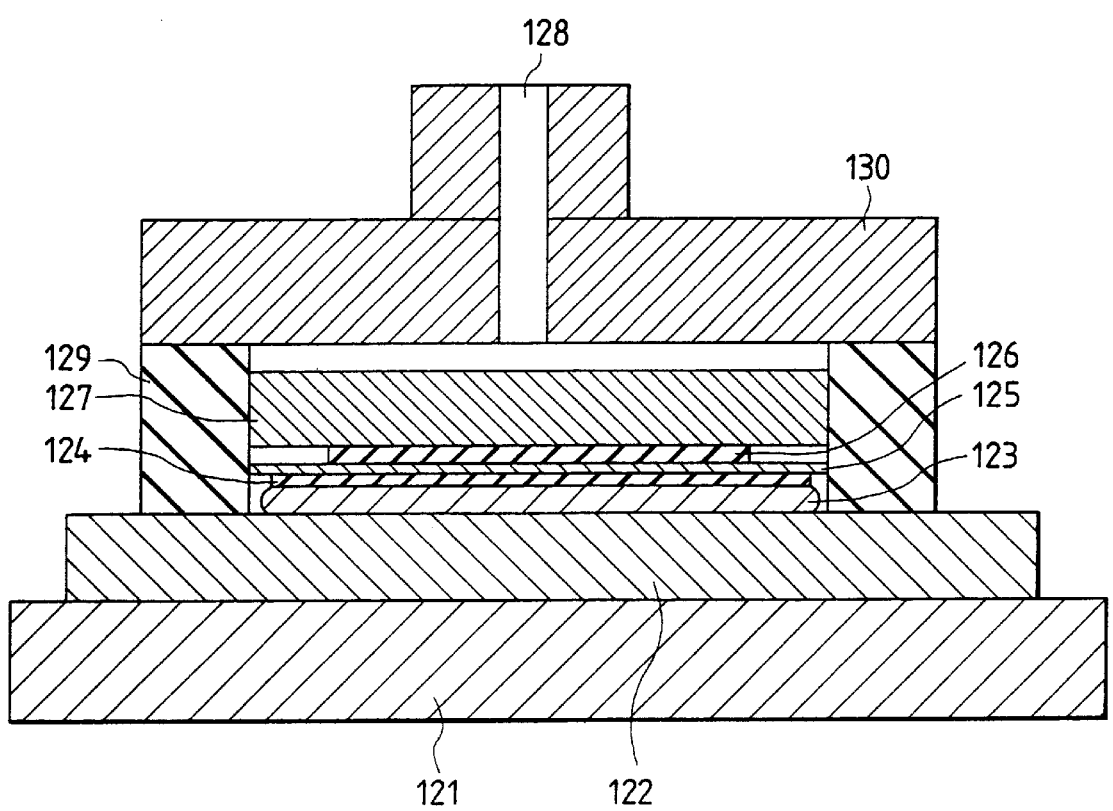

METHOD OF MANUFACTURING SEMICONDUCTOR INTEGRATED CIRCUIT DEVICE

BACKGROUND OF THE INVENTION

The present invention relates to a technique of manufacturing a semiconductor integrated circuit device, and particularly relates to the technique of chemical mechanical polishing (CMP) applied to the principal plane on the patterned side of a patterned semiconductor wafer, that is, a wafer for manufacturing a semiconductor integrated circuit (hereinafter called a wafer).

Recently, methods of manufacturing a semiconductor device, that is, a semiconductor integrated circuit device wherein irregularities on the principal plane on the patterned side of a patterned wafer are flattened by chemical mechanical polishing have been proposed. The technique for flattening irregularities on the principal plane on the patterned side of a patterned wafer by chemical mechanical polishing has the following problems, compared with the technique for flattening irregularities on the principal plane of a wafer before patterning by chemical mechanical polishing. A first problem is that the quantity of polishing equivalent to the quantity removed by processing is extremely limited. For example, the quantity in which a wafer before patterning is polished is several tens μm, while the quantity in which a patterned wafer is polished is approximately 0.5 μm. A second problem is that the flatness of the principal plane to be polished on the patterned side of a patterned wafer is by far indistinct, compared with that of a wafer before patterning. It is difficult to uniformly perform chemical mechanical polishing of irregularities on the overall principal plane on the patterned side of a patterned wafer in consideration of these problems.

For an example in which the technique for polishing a patterned wafer chemically and mechanically to conquer this difficulty is disclosed, there are Japanese published unexamined patent applications No. Hei 5(1993)-74749, Hei 6(1994)-15563 and No. Hei 5(1993)-69310. Any technique disclosed in these examples is based upon a principle that the overall principal plane to be polished on the patterned side is uniformly rubbed on the surface of an abrasive by pressing the patterned wafer by an elastic body in which pressure fluid is sealed.

SUMMARY OF THE INVENTION

The conventional type technique for chemical mechanical polishing of a patterned wafer utilizing the above principle has a problem that the a precision of 0.1 μm or less cannot be secured in relation to the uniformity of polished quantity described later.

The object of the present invention is to provide a semiconductor device manufacturing technique by which the polished surface of a patterned wafer can be uniformly polished precisely.

The above and other new objects and the new characteristics will be clarified from the description of the present invention and the attached drawings.

The summary of a typical one of the inventions disclosed in this patent application is as follows:

When the surface of a principal plane on the patterned side of a semiconductor wafer is undergoes chemical mechanical polishing, a wafer holding head in which a pressure plate provided with vents is held by the wafer holding head body provided with a gas inlet and an elastic film is provided on a principal plane on the side reverse to the side of the vents of the pressure plate is beforehand prepared. The above semiconductor wafer to be polished by chemical mechanical polishing is held with its principal plane on the side reverse to the patterned principal plane opposite to the above elastic film by the above wafer holding head. The surface of a principal plane on the patterned side of the held semiconductor wafer is rubbed on a polishing pad and chemical mechanical polishing is performed with the semiconductor wafer pressed by the action of the pressure of gas supplied to a gas inlet, being mechanically pressed by the pressure plate.

According to the above means, the polished surface is pressed on the polishing pad by force pressed by the pressure plate, that is, pressured and polished by chemical mechanical polishing. However, at this time, an as irregular and complicated distortion force operating upon the polished surface is corrected by the action of the pressure of gas by self-matching, the polished quantity on the polished surface is uniform overall. That is, it is considered that in a macroscopic view, the rear surface of a wafer receives both mechanical pressure by contact and gas pressure (fluid pressure) by a gas layer microscopically or semi-microscopically existing via a partition.

The partition for applying gas pressure has only to be provided with gastightness to some extent and for example, it may be provided with a single or plural pores with a minute area for vacuum attracting of a wafer.

Further, a brief description of the outline of the present invention is as follows:

1. A method of manufacturing a semiconductor integrated circuit device by chemical mechanical polishing of the surface of the principal plane on the patterned side of a patterned wafer for manufacturing an integrated circuit, comprising:

(a) a patterning process in which a pattern for forming a semiconductor integrated circuit is formed at least on one principal plane of a wafer for manufacturing an integrated circuit; and (b) a chemical mechanical polishing process in which a wafer holding head in which a pressure plate (which may be porous) provided with a vent is held by the wafer holding head body provided with a gas inlet and an elastic film is provided on the principal plane on the side reverse to the side of the gas inlet of the pressure plate is prepared beforehand, the wafer for manufacturing an integrated circuit is held by the wafer holding head with the principal plane on the side reverse to the principal plane on the patterned side mechanically in contact with the elastic film directly or via another sheet and the surface of the principal plane on the patterned side is rubbed on a polishing pad with the held wafer for manufacturing an integrated circuit mechanically pressed by the pressure plate and pressed by the action of the pressure of gas supplied to the gas inlet.

2. A method of manufacturing a semiconductor integrated circuit device described in the first item and characterized in that the periphery of the pressure plate and the elastic film are fixed to the head body by a guide ring for preventing a wafer for manufacturing an integrated circuit from being protruded.

3. A method of manufacturing a semiconductor integrated circuit device described in the first item and characterized in that the ratio of gas pressure to a load per unit area upon the wafer of manufacturing an integrated circuit by the pressure plate is set to 0.5 to 1.5.

4. A method of manufacturing a semiconductor integrated circuit device described in the first item and characterized in that a through hole for vacuum attracting of the wafer for manufacturing an integrated circuit is formed through the elastic film.

5. A method of manufacturing a semiconductor integrated circuit device described in the first item and characterized in that an elastic backing pad is provided between the elastic film and the wafer for manufacturing an integrated circuit.

6. A method of manufacturing a semiconductor integrated circuit device described in the fifth item and characterized in that the strength of the elasticity of the backing pad is varied depending upon a part opposite to the wafer for manufacturing an integrated circuit.

7. A method of manufacturing a semiconductor integrated circuit device by chemical mechanical polishing for flattening the surface of multilayer wiring of a wafer for manufacturing an integrated circuit, comprising:

(a) a first wiring formation process in which a first wiring is formed on a first insulating film formed on a wafer for manufacturing an integrated circuit;

(b) a second insulating film formation process in which a second insulating film is formed over the first insulating film and the first wiring;

(c) a flattening process in which a wafer holding head in which a pressure plate provided with a vent is held by a wafer holding head body provided with a gas inlet and an elastic film is provided on the principal plane on the side reverse to the side of the gas inlet of the pressure plate is prepared beforehand, the wafer for manufacturing an integrated circuit is held by the wafer holding head with the principal plane on the side reverse to the principal plane on which the second insulating film is formed mechanically in contact with the elastic film directly or via another sheet and the surface of the second insulating film is rubbed upon a polishing pad and flattened with the held wafer for manufacturing an integrated circuit mechanically pressed by the pressure plate and pressed by the action of the pressure of gas supplied to the gas inlet;

(d) a hole formation process in which a through hole or a contact hole is formed through the flattened second insulating film; and (e) a second wiring formation process in which a second wiring is formed on the second insulating film through which a hole is formed.

8. A method of manufacturing a semiconductor integrated circuit device in which the superficial part of the principal plane on the patterned side of a patterned wafer for manufacturing an integrated circuit is removed by chemical mechanical polishing, comprising:

(a) a device isolation groove formation process in which a device isolation groove is formed on the principal plane on the patterned side of the wafer;

(b) an insulating film deposition process in which an insulating film is deposited on the principal plane on the patterned side and a part which is filled with insulating material is formed inside the device isolation groove;

(c) a device isolating part formation process in which a wafer holding head in which a pressure plate provided with a vent is held by a wafer holding head body provided with a gas inlet and an elastic film is provided on the principal plane on the side reverse to the side of the gas inlet of the pressure plate is prepared beforehand, the wafer for manufacturing an integrated circuit is held by the wafer holding head with the principal plane on the side reverse to the principal plane on the patterned side mechanically in contact with the elastic film directly or via another sheet, the surface of the insulating film is rubbed upon a polishing pad and polished by chemical mechanical polishing with the held wafer for manufacturing an integrated circuit mechanically pressed by the pressure plate and pressed by the action of the pressure of gas supplied to the gas inlet and a device isolating part is formed by the parts which are filled with insulating material; and (d) a gate formation process in which a gate is formed on a device forming part surrounded by the device isolating parts on the principal plane on the patterned side.

9. A method of manufacturing a semiconductor integrated circuit device by chemical mechanical polishing of the surface of the principal plane on the patterned side of a patterned wafer for manufacturing an integrated circuit, comprising:

(a) a patterning process in which a pattern for forming a semiconductor integrated circuit device is formed at least on one principal plane of a wafer for manufacturing an integrated circuit; and (b) a chemical mechanical polishing process in which a wafer holding head in which a pressure plate provided with a vent is held by a wafer holding head body provided with a gas inlet and an elastic film is provided on the principal plane on the side reverse to the side of the gas inlet of the pressure plate is prepared beforehand, the wafer for manufacturing an integrated circuit is held by the wafer holding head with the principal plane on the side reverse to the principal plane on the patterned side mechanically in contact with the elastic film directly or via another sheet, the surface of the principal plane on the patterned side is rubbed upon a polishing pad.

10. A method of manufacturing a semiconductor integrated circuit device described in the ninth item and characterized in that the ratio of gas pressure to a load per unit area upon the wafer for manufacturing an intergrated circuit by the pressure plate is set to 0.5 to 1.5.

11. A method of manufacturing a semiconductor integrated circuit device described in the tenth item and characterized in that a backing pad softer than a wafer is provided between the elastic film and the wafer for manufacturing an integrated circuit.

12. A method of manufacturing a semiconductor integrated circuit device described in the eleventh item and characterized in that the strength of the elasticity of the backing pad is varied depending upon a part opposite to the wafer for manufacturing an integrated circuit.

13. A method of manufacturing a semiconductor integrated circuit device described in the twelfth item and characterized in that a through hole for vacuum attracting of the wafer for manufacturing an integrated circuit is formed through the elastic film.

14. A method of manufacturing a semiconductor integrated circuit device described in the thirteenth item and characterized in that the periphery of the pressure plate and the elastic film is fastened to the head body by a guide ring for preventing the wafer for manufacturing an integrated circuit from being protruded.

15. A method of manufacturing a semiconductor integrated circuit device by chemical mechanical polishing for flattening the surface of multilayer wiring of a wafer for manufacturing an integrated circuit device, comprising:

(a) a first wiring formation process in which first wiring is formed on a first insulating film formed on a wafer for manufacturing an integrated circuit;

(b) a second insulating film formation process in which a second insulating film is formed over the first insulating film and the first wiring;

(c) a flattening process in which a wafer holding head in which a pressure plate provided with a vent is held by a wafer holding head body provided with a gas inlet and an elastic film is provided on the principal plane on the side reverse to the side of the gas inlet of the pressure plate is prepared beforehand, the wafer for manufacturing an integrated circuit is held by the wafer holding head with the principal plane on the side reverse to the principal plane on which the second insulating film is formed mechanically in contact with the elastic film directly or via another sheet and the surface of the second insulating film is rubbed upon a polishing pad and flattened with the held wafer for manufacturing an integrated circuit mechanically pressed by the pressure plate and pressed by the action by the pressure of gas supplied to the gas inlet;

(d) a hole formation process in which a through hole or a contact hole is formed through the flattened second insulating film; and (e) a second wiring formation process in which a second wiring is formed on the second insulating film through which a hole is formed.

16. A method of manufacturing a semiconductor integrated circuit device in which the superficial part of the principal plane on the patterned side of a patterned wafer for manufacturing an integrated circuit is removed by chemical mechanical polishing, comprising:

(a) a device isolation groove formation process in which a device isolation groove is formed on the principal plane on the patterned side;

(b) an insulating film deposition process in which an insulating film is deposited on the principal plane on the patterned side and at least a part which is filled with insulating material is formed inside the device isolation groove;

(c) a device isolating part formation process in which a wafer holding head in which a pressure plate provided with a vent is held by a wafer holding head body provided with a gas inlet and an elastic film is provided on the principal plane on the side reverse to the side of the gas inlet of the pressure plate is beforehand prepared, the wafer for manufacturing an integrated circuit is held by the wafer holding head with the principal plane on the side reverse to the principal plane on the patterned side mechanically in contact with the elastic film directly or via another sheet, the surface of the insulating film is rubbed upon a polishing pad and polished by chemical mechanical polishing with the held wafer for manufacturing an integrated circuit mechanically pressed by the pressure plate and pressed by the action by the pressure of gas supplied to the gas inlet and a device isolating part is formed by the parts which are filled with insulating material; and (d) a gate formation process in which a gate is formed on a device forming part surrounded by the device isolating parts over the principal plane on the patterned side.

17. A method of manufacturing a semiconductor integrated circuit device, comprising:

(a) a first thin film formation process in which a first thin film layer is formed directly or indirectly over the first principal plane over which at least a first pattern layer is formed of a wafer for manufacturing an integrated circuit; and (b) a first surface flattening process in which the surface is flattened by polishing the first principal plane of the wafer over which the first thin film is formed by chemical mechanical polishing.

The above first surface flattening process is executed as follows:

(i) the wafer is held between a polishing pad and a pressure plate provided with a vent via an elastic partition; and (ii) by relatively displacing the pressure plate and the polishing pad with the pressure plate and the center except at least the periphery of a second principal plane of the wafer pressing directly via the partition or indirectly via further another sheet in a mechanically contact state in a macroscopic view, (iii) chemical mechanical polishing is executed.

18. A method of manufacturing a semiconductor integrated circuit device described in the seventeenth item in which the ratio of gas pressure to a load per unit area upon the wafer by the pressure plate is set to 0.5 to 1.5 when polished.

19. A method of manufacturing a semiconductor integrated circuit device described in the eighteenth item in which a part to which mixed pressure including mechanical pressure and gas pressure is applied is equivalent to the substantially overall second principal plane of the wafer.

20. A method of manufacturing a semiconductor integrated circuit device described in the nineteenth item in which the above partition is provided with gastightness to an extent that pressure substantially operates as static pressure.

21. A method of manufacturing a semiconductor integrated circuit device described in the twentieth item in which a backing pad softer than a wafer is provided between the partition and the wafer for manufacturing an integrated circuit.

22. A method of manufacturing a semiconductor integrated circuit device, comprising;

(a) a first thin film formation process in which a first thin film layer is formed directly or indirectly over a first principal plane over which at least a first pattern layer is formed of a wafer for manufacturing an integrated circuit; and (b) a first surface flattening process for flattening the surface by chemical mechanical polishing of the first principal plane of the wafer over which the first thin film is formed.

The above first surface flattening process is executed as follows:

(i) the wafer is held between a polishing pad and a pressure plate provided with a vent via an elastic partition provided with gastightness to an extent that pressure substantially operates as static pressure; and (ii) by relatively displacing the pressure plate and the polishing pad with the pressure plate and the center except at least the periphery of a second principal plane of the wafer pressing directly via the partition or indirectly via further another sheet in a mechanically contact state in a macroscopic view, (iii) chemical mechanical polishing is executed.

23. A method of manufacturing a semiconductor integrated circuit device, comprising:

(a) a first thin film formation process in which a first thin film layer is formed directly or indirectly over a first principal plane over which at least a first pattern layer is formed of a wafer for manufacturing an integrated circuit; and (b) a first surface flattening processing in which the surface is flattened by chemical mechanical polishing of the first principal plane of the wafer on which the first thin film is formed.

The above first surface flattening process is executed as follows:

(i) the wafer is held between a polishing pad and a pressure plate provided with a vent via an elastic partition; and (ii) by relatively displacing the pressure plate and the polishing pad with the pressure plate and a substantially overall second principal plane of the wafer pressing directly via the partition or indirectly via further another sheet in a mechanically contact state in a macroscopic view, (iii) chemical mechanical polishing is executed.

24. A method of polishing a board for manufacturing an integrated circuit device, comprising:

(a) a first thin film formation process in which a first thin film layer is formed directly or indirectly over a first principal plane over which at least a first pattern layer is formed of a board for manufacturing an integrated circuit; and (b) a first surface flattening process in which the surface is flattened by chemical mechanical polishing of the first principal plane of the board on which the first thin film is formed.

The above first surface flattening process is executed as follows:

(i) the board is held between a polishing pad and a pressure plate provided with a vent via an elastic partition; and (ii) by relatively displacing the pressure plate and the polishing pad with the pressure plate and at least a part of a second principal plane of the board pressing directly via the partition or indirectly via further another sheet in a mechanically contact state in a macroscopic view, (iii) chemical mechanical polishing is executed.

25. A method of manufacturing a semiconductor integrated circuit device, comprising:

(a) a first thin film formation process in which a first thin film layer is formed directly or indirectly over a first principal plane over which at least a first pattern layer is formed of a wafer for manufacturing an integrated circuit; and (b) a first surface flattening process in which the surface is flattened by chemical mechanical polishing of the first principal plane of the wafer on which the first thin film is formed.

The above first surface flattening process is executed as follows:

(i) the wafer is held between a polishing pad and a pressure plate provided with a vent via an elastic partition; and (ii) by relatively displacing the pressure plate and the polishing pad with the pressure plate and at least a part of a second principal plane of the wafer pressing directly via the partition or indirectly via further another sheet by substantially both mechanical pressure and gas pressure, (iii) chemical mechanical polishing is executed.

26. A method of manufacturing a semiconductor integrated circuit device, comprising:

(a) a first thin film formation process in which a first thin film layer is formed directly or indirectly over a first principal plane over which at least a first pattern layer is formed of a wafer for manufacturing an integrated circuit; and (b) a first surface flattening process in which the surface is flattened by chemical mechanical polishing of the first principal plane of the wafer on which the first thin film is formed.

The above first surface flattening process is executed as follows:

(i) the wafer is held between a polishing pad and a pressure plate via an elastic partition; and (ii) by relatively displacing the pressure plate and the polishing pad with the pressure plate and at least a part of a second principal plane of the wafer pressing directly via the partition or indirectly via further another sheet by substantially both mechanical pressure and gas pressure, (iii) chemical mechanical polishing is executed.

27. A method of manufacturing a semiconductor integrated circuit device, comprising:

(a) a first thin film formation process in which a first thin film layer is formed directly or indirectly over a first principal plane over which at least a first pattern layer is formed of a wafer for manufacturing an integrated circuit; and (b) a first surface flattening process in which the surface is flattened by chemical mechanical polishing of the first principal plane of the wafer on which the first thin film is formed.

The above first surface flattening process is executed as follows:

(i) the wafer is held between a polishing pad and a pressure plate provided with a vent via an elastic partition provided with gastightness to an extent that pressure substantially operates as static pressure; and (ii) by relatively displacing the pressure plate and the polishing pad with the pressure plate and the center except at least the periphery of a second principal plane of the wafer pressing directly via the partition or indirectly via another sheet in a mechanically contact state in a macroscopic view, (iii) chemical mechanical polishing is executed.

28. A method of manufacturing a semiconductor integrated circuit device, comprising:

(a) a first thin film formation process in which a first thin film layer is formed directly or indirectly over a first principal plane over which at least a first pattern layer is formed of a wafer for manufacturing an integrated circuit; and (b) a first surface flattening process in which the surface is flattened by chemical mechanical polishing of the first principal plane of the wafer on which the first thin film is formed.

The above first surface flattening process is executed as follows:

(i) the wafer is held between a polishing pad and a pressure plate via a partition provided with gastightness to an extent that pressure substantially operates as static pressure; and (ii) by relatively displacing the pressure plate and the polishing pad with the pressure plate and a substantially overall second principal plane of the wafer pressing directly via the partition or indirectly via further another sheet in a mechanically contact state in a macroscopic view, (iii) chemical mechanical polishing is executed.

BRIEF DESCRIPTION OF THE DRAWINGS

FIG. 2 is an exploded perspective drawing; showing a head of the patterned wafer polishing machine of FIG. 1;

FIGS. 4A to 4E are enlarged partial sectional views for explaining a method of manufacturing a semiconductor device according to an embodiment of the present invention wherein, FIG. 4A shows a first wiring forming process, FIG. 4B shows a second insulating film forming process, FIG. 4C shows a flattening process, FIG. 4D shows a hole forming process and FIG. 4E shows a second wiring forming process;

FIGS. 6A to 6C are graphs showing the distribution of polishing speed wherein, FIG. 6A is a graph in a case where chemical mechanical polishing is performed under the condition of a pressure ratio S shown by a in FIG. 5, FIG. 6B is a graph in a case where chemical mechanical polishing is performed under the condition of a pressure ratio S shown by b FIG. 5 and FIG. 6C is a graph in a case where chemical mechanical polishing is performed under the condition of a pressure ratio S shown by c in FIG. 5;

FIGS. 7A to 7G are enlarged partial sectional views showing a case where a method of manufacturing a semiconductor device according to a second embodiment of the present invention is applied to an SGI (Shallow Groove Isolation) method, wherein FIG. 7A shows a device isolation groove forming process, FIG. 7B shows an insulating film forming process, FIG. 7C shows an insulating film removing process, FIG. 7D shows an insulating film removing process in a state in which the insulating film is unevenly removed, FIG. 7E shows a mask removing process, FIG. 7F shows a gate oxide film forming process and FIG. 7G shows impurities diffusing and gate electrode forming processes;

FIGS. 9A and 9B are explanatory drawings wherein FIG. 9A is a plan showing the arrangement of pellets of a patterned wafer and FIG. 9B is a graph showing an effect which the mean compression elastic modulus in the periphery of a polishing speed distribution control pad has upon the uniformity of polishing speed;

FIG. 12 is a schematic sectional view showing a polishing machine when chemical mechanical polishing is performed in a fifth embodiment according to the present invention;

DETAILED DESCRIPTION OF THE PREFERRED EMBODIMENTS

For convenience, the present invention will be described below with respect to several embodiments into which the present invention is classified. Each embodiment, however, is not separate in detail but it need scarcely be said that, for example a device and a process used for one embodiment are applied to the processing of a semiconductor integrated circuit in another embodiment as they are or with them suitably transformed if necessary and vice versa.

Further, a device or a process repeatedly used or applied in each embodiment is not repeatedly described except when repeated description is particularly required.

Each element constituting an embodiment is not essential as a principle unless specified.

Further, when the same plural components are described in an embodiment, such a component may be single and may be also plural except when it is specified that some or more are essential or when a problem that no operation is performed by a specific number is obvious. Conversely, when only a single component is described in an embodiment, such a component may be single and may be also plural except when it is specified that singleness is a condition or when a problem that no operation is performed by a specific plural number is obvious.

(1) First Embodiment

Figure 1:
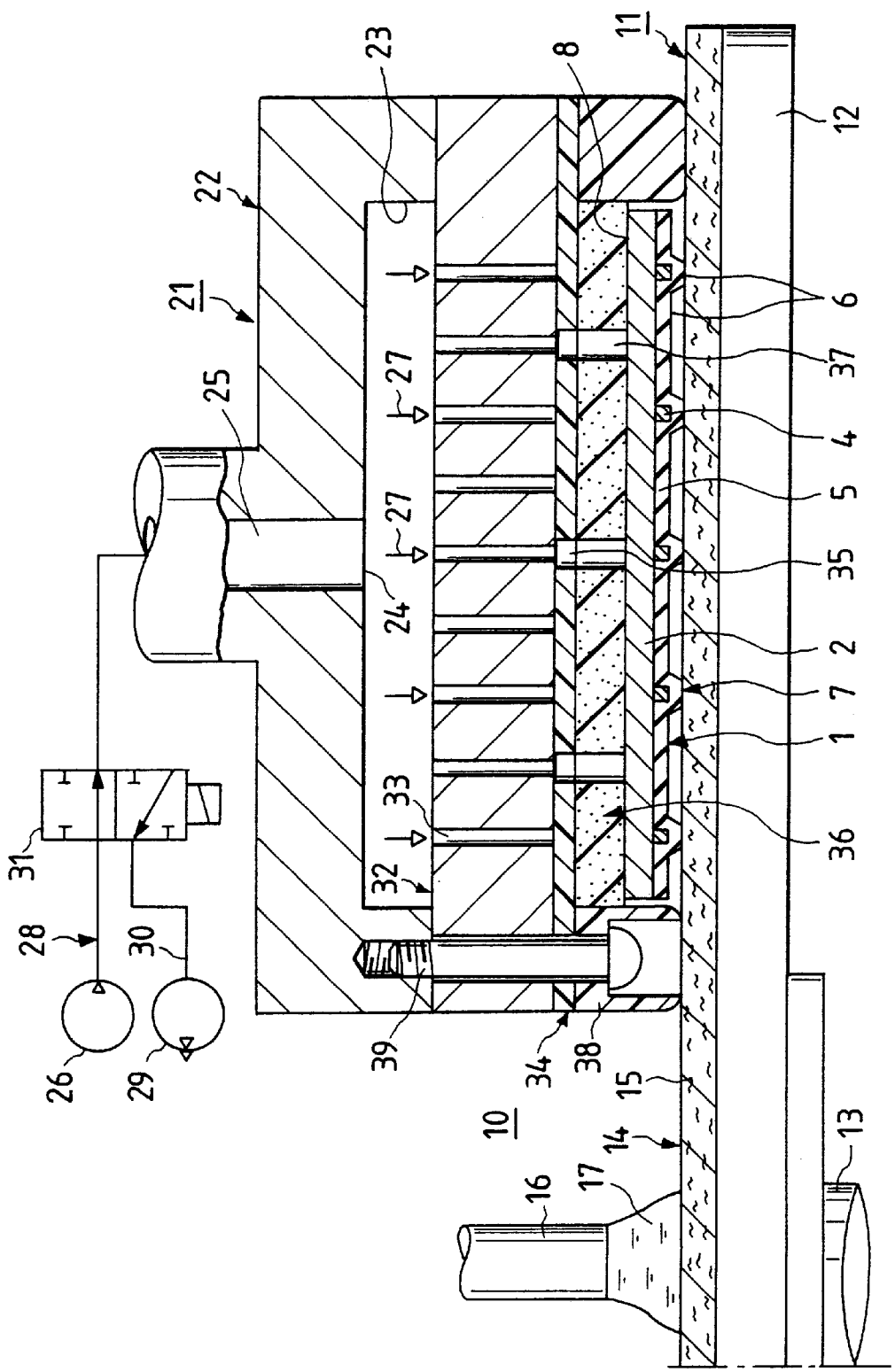
FIG. 1 is a front sectional view showing a patterned wafer polishing machine used for a method of manufacturing a semiconductor device according to a first embodiment of the present invention.
Figure 3A:
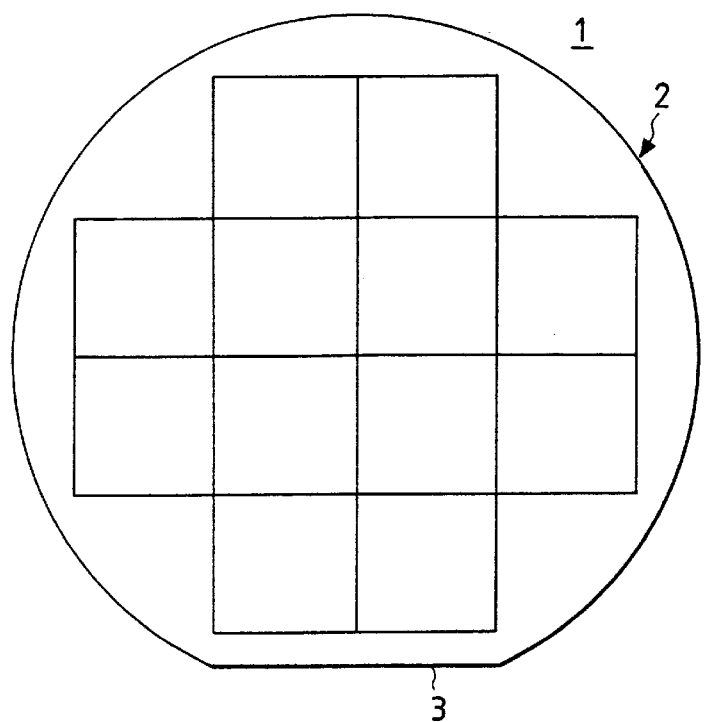
FIG. 3A is a plan view of a wafer.

FIG. 1 is a front view, a part of which is showing in section and showing a patterned wafer polishing machine used for a method of manufacturing a semiconductor device according to a first embodiment of the present invention. FIG. 2 is an exploded perspective drawing showing the head of the first embodiment. FIGS. 3(a) and (b) explanatory drawings for explaining a method of manufacturing a semiconductor device according to the first embodiment.

In this embodiment, for a method of manufacturing a semiconductor device according to the present invention, a patterned wafer polishing machine shown in FIG. 1 is used. The patterned wafer polishing machine 10 shown in FIG. 1 is constituted by a chemical mechanical polishing machine for performing chemical mechanical polishing of a wafer, holding the wafer by the head and rubbing the polished surface of the wafer on a polishing pad to which an abrasive is supplied.

A patterned wafer (hereinafter called a wafer) shown in FIGS. 3(a) and (b) is the object of a method of manufacturing a semiconductor device according to the present invention and the wafer of the patterned wafer polishing machine 10 will be briefly described below. The wafer 1 shown in FIGS. (a) and (b) consists of a wafer 2 (hereinafter called a substrate), a part of the periphery of which is a linear part 3. A memory M which is an example of a semiconductor device is formed in a surface layer area on the principal plane on the patterned side (hereinafter called the surface) of the substrate 2 and wire 4 formed by a wiring layer film which is an example of a metallic film and an interlayer insulating film 5 which is an example of an insulating film are respectively formed on the surface. As the wiring 4 is formed by a thick wire, irregularities 6 are formed on the surface of the interlayer insulating film 5 formed on the wire, reflecting the irregularities of the wiring 4 on the lower layer. In this embodiment, the interlayer insulating film 5 is flattened by removing a part of the surface of this interlayer insulating film 5 by chemical mechanical polishing using the patterned wafer polishing machine 10. Therefore, the surface of the interlayer insulating film 5 forms the polished surface 7 polished by the patterned wafer polishing machine 10.

The patterned wafer polishing machine 10 is provided with a polishing tool and a head. The polishing tool 11 is provided with a disc base plate 12 with a sufficiently larger radius than the diameter of a wafer 1 and the base plate 12 is supported so that it can be turned on a horizontal plane. A rotation shaft 13 arranged vertically is fixed in the center of the lower surface of the base plate 12 and the base plate 12 is constituted so that it can be turned by the rotation shaft 13. The polishing pad 14 is uniformly stuck on the overall upper surface of the base plate 12. The polishing pad 14 is an abrasive in which a minute particle of a grinding stone such as colloidal silica is included in a pad having synthetic resin, the surface of which is porous and the surface functions as an abrasive surface 15. In polishing by the polishing pad 14, chemical mechanical polishing for enhancing the effect of polishing using etchant (abrasive solution called slurry, hereinafter called slurry) is executed in addition to mechanical polishing. Therefore, a slurry supply nozzle 16 for supplying slurry 17 is arranged substantially over the central line of the polishing tool 11.

The head 21 is provided with a body 22 having a little larger diameter than that of a wafer 1 and formed in the shape of a disc and a circular holding hole 23 with fixed depth is concentrically embedded in the lower part of the body 22. The diameter of the holding hole 23 is formed so that it is a little larger than that of a wafer 1. A gas inlet 24 is provided in the center of the holding hole 23 and a gas passage 25 is connected to the gas inlet 24. The gas passage 25 may constitute a positive pressure supply passage 28 for supplying air 27 as positive pressure gas to the gas inlet 24 by connecting the other end of the gas passage 25 to an air pump 26. The gas passage 25 also may constitute a negative pressure supply passage 30 for supplying negative pressure to the gas inlet 24 by connecting the other end of the gas passage 25 to a vacuum pump 29. Therefore, the gas passage 25 functions as both the positive pressure supply passage 28 and the negative pressure supply passage 30. A selector 31 is provided on the way of the positive pressure supply passage 28 and the negative pressure supply passage 30 and they are switched by the selector 31.

A pressure plate 32 in which plural vents 33 pierced in the direction of the thickness are provided is stuck on the lower surface of the head body 22 and seals the opening of the holding hole 23. The periphery of the pressure plate 32 is fastened to the head body 22 by a bolt described later. The pressure plate 32 is made of rigid material and formed in the shape of a disc so that the diameter is larger than that of the holding hole 23 and smaller than that of the head body 22. As the rigid pressure plate 32 is stuck on the lower surface of the head body 22, the lower surface mechanically presses a wafer 1 when the head 21 is lowered. The plural vents 33 are uniformly distributed from the center of the pressure plate 32. The vents 33 constitute a gas passage communicating with space in the holding hole 23 partitioned by the pressure plate 32. Therefore, the vents 33 circulate positive pressure and negative pressure between the side of the gas inlet 24 and the reverse side inside of the holding hole 23.

An elastic film 34 is stuck on the lower surface of the pressure plate 32 and the elastic film 34 seals the lower openings of all the vents 33. The periphery of the elastic film 34 is fastened to the head body 22 by a bolt described later. The elastic film 34 is formed by a polyethylene terephthalate film approximately 250 μm thick. Plural through holes 35 pierced in the direction of the thickness of the elastic film 34 are suitably arranged so that they can attract a wafer 1.

A backing pad 36 in the shape of a disc with an outside diameter substantially equal to the bore diameter of the holding hole 23 is stuck on the lower surface of the elastic film 34 by a concentric adhesive layer not shown. The backing pad 36 is formed by urethane foam and a flexible layer is uniformly constituted on the overall surface which is in contact with a wafer 1 because urethane foam is porous. Plural through holes 37 pierced in the direction of the thickness of the backing pad 36 are arranged so that the plural through holes 37 are respectively opposite to each through hole 35 of the elastic film 34.

A guide ring 38 is stuck on the periphery of the lower surface of the elastic film 34 and fastened to the head body 22 together with the pressure plate 32 and the elastic film 34 by plural bolts 39. The guide ring 38 is formed by resin with hardness sufficiently lower than that of the polished surface 7 of a wafer 1 so that the outside diameter is equal to that of the head body 22 and the bore diameter is substantially equal to that of the holding hole 23. The guide ring 38 prevents a wafer 1 from being protruded outside in polishing and holds the polished surface 7 of the wafer 1 exposed downward. The backing pad 36 is fitted into the hollow part of the guide ring 38.

The head 21 is supported on a horizontal plane with the gas inlet 24 in the center so that it can be rotated. The head 21 is rotated by a rotation drive not shown. The head 21 is reciprocated between a station provided with the polishing tool 11 and a loading station on which a wafer is separately loaded by a transport mechanism. The head 21 is extremely slightly lowered in polishing.

Next, referring to FIGS. 4A to 4E, a method of manufacturing a semiconductor device equivalent to an embodiment according to the present invention will be described below by an example that multilayer wiring is formed.

Figure 4A:
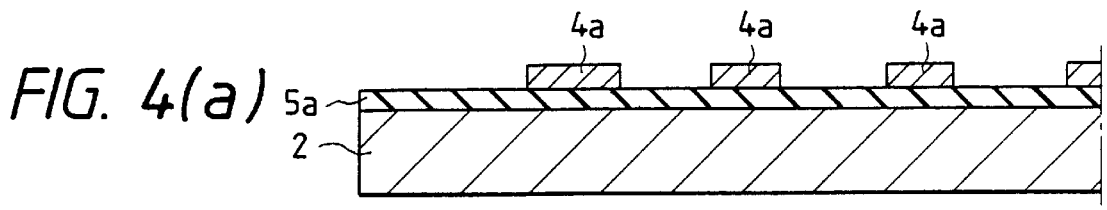

As shown in FIG. 4A, a first insulating film 5a in multilayer wiring is formed on the surface of a substrate 2. Next, first wiring 4a is patterned on the first insulating film 5a by the deposition of metallic film, lithography and etching. However, a word line and others made of polysilicon and others are included in the first wiring 4a.

Figure 4B:
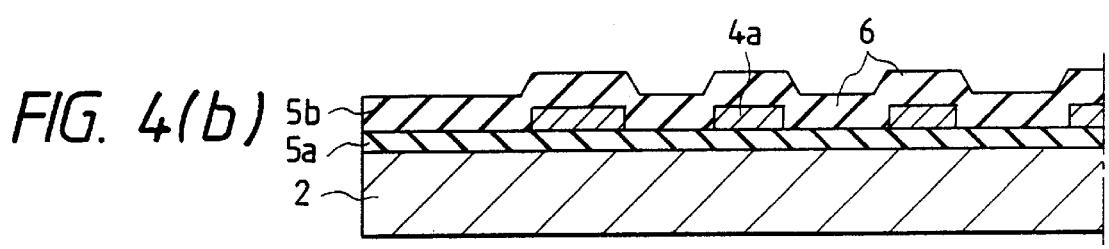

Next, as shown in FIG. 4B, a second insulating film 5b made of $SiO_2$, $Si_3N_4$ and others is deposited on the first insulating film 5a of the substrate 2 by chemical vapor deposition (CVD). The second insulating film 5b coats the first wiring 4a. A convex portion with thickness equivalent to that of the first wiring 4a is formed on the surface of the second insulating film 5b. In other words, a large number of irregularities 6 are formed on the surface to be polished 7. A wafer in this state is supplied to the patterned wafer polishing machine 10 used for a flattening process in the method of manufacturing a semiconductor device according to this embodiment.

The wafer 1 supplied to the patterned wafer polishing machine 10 is inserted into the guide ring 38 with the polished surface 7 placed facing downwardly as shown in FIG. 1. When the wafer 1 is inserted into the guide ring 38, the selector 31 is switched and negative pressure is supplied to the gas inlet 24 through the negative pressure supply passage 30. As negative pressure is applied to the principal plane 8 (hereinafter called the rear surface) on the side reverse to the polished surface 7 of the wafer 1 through the vents 33 of the pressure plate 32, the through hole 35 of the elastic film 34 and the through hole 37 of the backing pad 36, the wafer 1 is attracted by the head 21. After the head 21 attracting the wafer 1 is moved immediately over the polishing tool 11 by the transport mechanism, it is lowered. When the polished surface 7 of the wafer 1 is in contact with the abrasive surface 15 of the polishing pad 14 by the lowering of the head 21, the selector is switched and air 27 is supplied to the gas inlet 24 through the positive pressure supply passage 28.

Next, the polishing tool 11 and the head 21 are respectively rotated with slurry 17 supplied to the abrasive surface 15 from the slurry supply nozzle 16. Afterward, the head 21 is lowered extremely little by little. The wafer 1 is vertically pressed by the pressure plate 32 via the backing pad 36 and the elastic film 34 by the lowering of the head 21. Simultaneously, as air 27 supplied from the positive pressure supply passage 28 to the gas inlet 24 is supplied to the lower surface side of the pressure plate 32 through the vents 33 of the pressure plate 32, the wafer 1 is also vertically pressed by action of the pressure of the air 27. Therefore, the polished surface 7 of the wafer 1 is rubbed by the abrasive surface 15 with the surface simultaneously pressed by mechanical force on the abrasive surface 15 of the polishing pad 14 by the pressure plate 32 and action by the pressure of air 27. Simultaneously, as slurry 17 is supplied to the abrasive surface 15 from the slurry supply nozzle 16, chemical mechanical polishing for enhancing the effect of polishing is executed in addition to mechanical polishing.

As the polished surface 7 is mechanochemically polished by the abrasive surface 15 and slurry 17 with the wafer 1 simultaneously pressed by mechanical force on the abrasive surface 15 by the pressure plate 32 and action by the pressure of air 27, the quantity in which the polished surface 7 is polished by the abrasive surface 15 is uniform overall. In chemical mechanical polishing, the wafer 1 is pressed by mechanical force pressed by the pressure plate 32, that is, pressure. However, at this time, as irregular and complicated distortion force operating on the polished surface 7 from the side of the abrasive surface 15 is corrected by the action of the pressure of air 27 by self-matching, the quantity in which the polished surface 7 is polished, is uniform overall.

As the surface of the second insulating film 5b constituting the polished surface 7 is uniformly polished overall, the irregularities 6 are removed overall, the second insulating film 5b with uniform thickness overall is formed and extremely satisfactory flattening is realized. In chemical mechanical polishing, convex portions of the irregularities 6 formed on the second insulating film 5b which is the polished surface 7 of the wafer 1 are first removed and the surface of the second insulating film 5b is gradually flattened. At this time, as the polished surface 7 is uniformly polished overall, the thickness of the polished surface 7 of the second insulating film 5b is uniformly reduced overall. As the second insulating film 5b is uniformly deposited overall, the thickness of the polished surface 7 of the second insulating film 5b after polishing is uniform overall if the polished quantity is uniform overall. Therefore, the second insulating film 5b can be flattened without polishing the first wiring 4a by suitably setting the quantity polished by the patterned wafer polishing machine 10 based upon the relationship among the thickness of the second insulating film 5b before polishing, the thickness of the first wiring 4a and the irregularities 6.

Figure 4C:
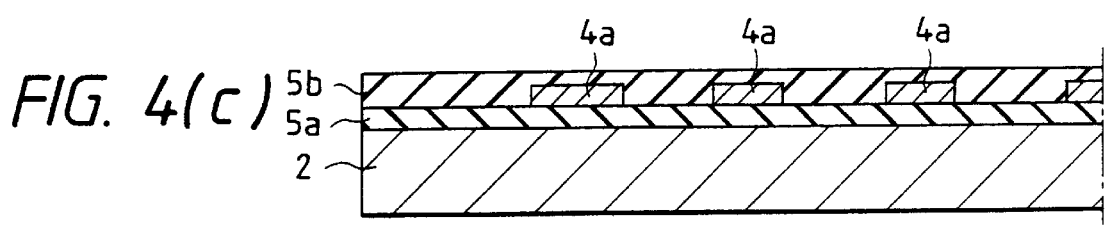

When the set polished quantity of chemical mechanical polishing is finished, the surface of the second insulating film 5b which is the polished surface 7 of the wafer 1 is flattened extremely precisely as shown in FIG. 4C and the second insulating film 5b with preset layer thickness is left over the first wiring 4a.

Figure 4D:
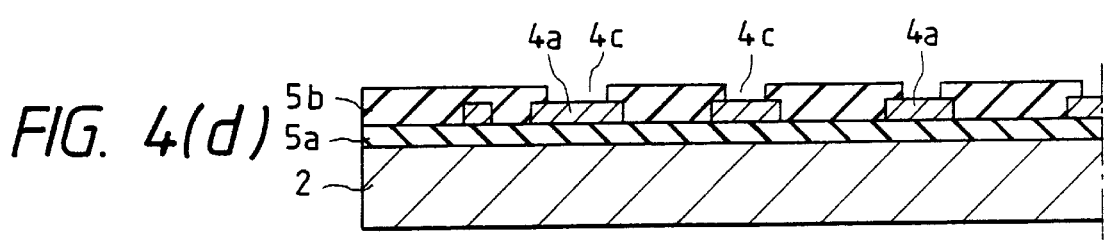

The wafer 1 in this state is housed in a wafer cassette by an unloader from the patterned wafer polishing machine 10 and after a following cleaning process, the wafer is sent to a hole formation process. In the hole formation process, a through hole 4c is provided over the predetermined first wiring 4a in the second insulating film 5b of the wafer 1 as shown in FIG. 4D.

Figure 4E:
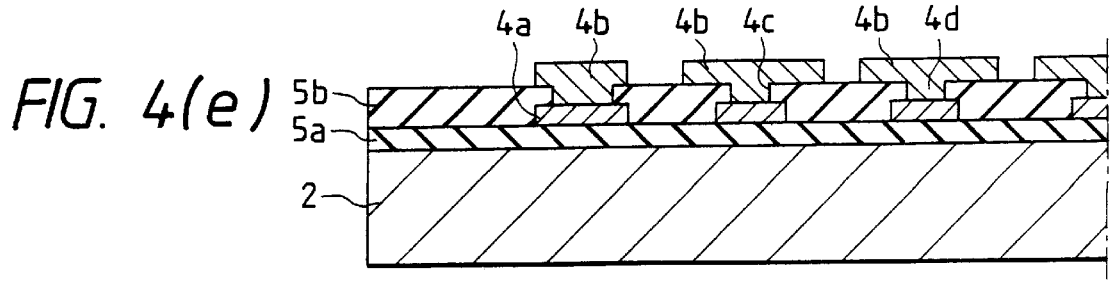

Next, in a second wiring formation process, second wiring 4b is patterned on the second insulating film 5b by metallic film deposition, lithography and etching processing as shown in FIG. 4E. At this time, as the surface of the second insulating film 5b is precisely flattened, the second wiring 4b is extremely precisely patterned. In patterning the second wiring 4b, a part of a metallic film deposited on the second insulating film 5b fills the through hole 4c provided in the second insulating film 5b. A through hole conductor 4d is formed by metal filled in the through hole 4c. A predetermined part of the patterned second wiring 4b is electrically connected to the first wiring 4a via the through hole conductor 4d.

Figure 3B:
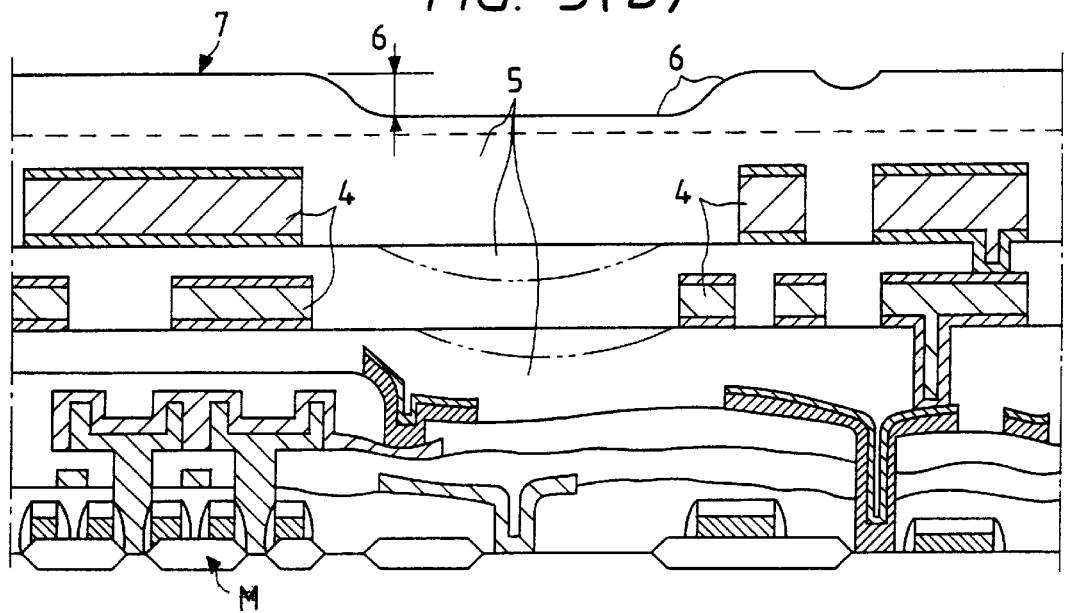
FIG. 3B is an enlarged partial sectional view of a wafer.

Multilayer wiring shown in FIG. 3B is formed by repeating the above insulating film formation process, flattening process, hole formation process and wiring formation process. At this time, an insulating film and wiring in a layer formed in a former process are equivalent to an insulating film and wiring in the lower layer in the next process. A hole is not limited to a through hole and also includes a contact hole. A hole not only connects wiring in a first layer and wiring in a second layer but connects wiring in the first layer and wiring in a third or fourth layer.

The effect which the relationship between mechanical force pressed by the pressure plate 32, that is, pressure and action by the pressure of air 27 has upon chemical mechanical polishing will be described below, referring to FIGS. 5 and 6.

Figure 5:
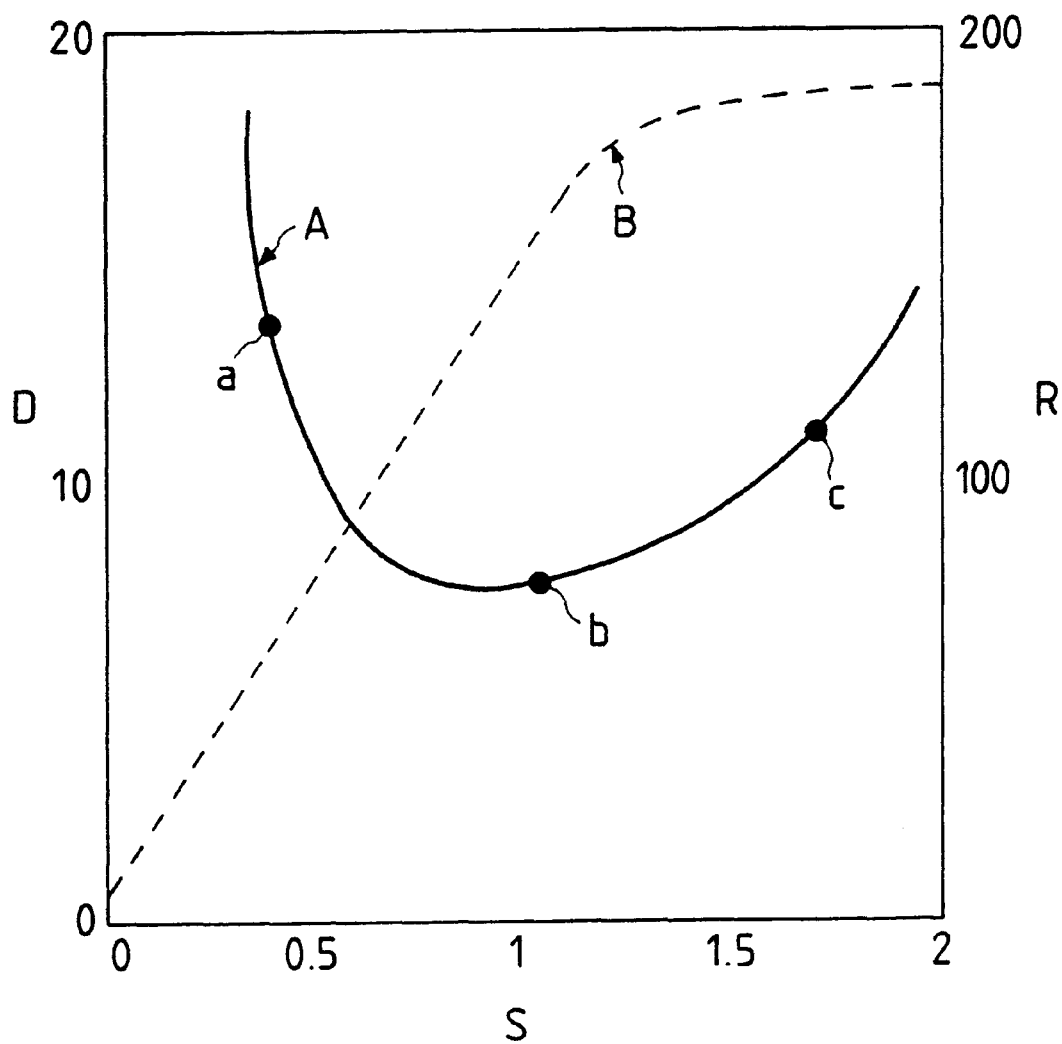
FIG. 5 is a graph showing an effect which the relationship between mechanical pressure by a pressure plate and action by air pressure has upon the uniformity of polished quantity of chemical mechanical polishing and means polishing speed.

FIG. 5 is a graph showing the effect which the relationship between mechanical force pressed by the pressure plate 32, that is, pressure and action by the pressure of air 27, has upon the uniformity of polished quantity and a mean polishing speed of chemical mechanical polishing. This graph shows a process in which a silicon oxide film formed on a silicon wafer with a diameter of eight inches is mechanochemically polished by the patterned wafer polishing machine 10. This graph is obtained by gradually changing the relationship between mechanical force pressed by the pressure plate 32, that is, pressure and action by the pressure of air 27. In FIG. 5, a horizontal axis shows the ratio S (hereinafter called pressure ratio) of air pressure to mechanical pressure by the pressure plate (a value obtained by dividing a load applied to the head 21 by the area of a silicon wafer) and a vertical axis shows the uniformity D (left side) of polished quantity and a mean polishing speed R (right side) on a silicon wafer plane. The uniformity D of polished quantity is shown by percentage (%) and is obtained according to an expression, D=(maximum polished quantity−minimum polished quantity)/(maximum polished quantity+minimum polished quantity)×100. The mean polishing speed R is a value obtained by dividing the total polishing speed at each measuring point by the number of measuring points. Polishing speed means polished quantity per unit time and polished quantity means the dimension of the thickness of a silicon oxide film removed by chemical mechanical polishing. A curve A in FIG. 5 shows the characteristics of the uniformity of polished quantity based upon pressure ratio and a curve B shows the mean polishing speed based upon pressure ratio.

The following is shown from FIG. 5. The uniformity D of polished quantity is satisfactory in the range in which the pressure ratio S is approximately 0.7 to 1.5. The mean polishing speed R is increased until S=1 and is increased no more when S≧1. The reason why the mean polishing speed R is increased no more when S≧1 is that the uniformity of polished quantity is deteriorated. The reason why the uniformity of polished quantity is deteriorated is that when pressure ratio S is excessive, the elastic film 34 is completely separated from the contact surface of the pressure plate 32 and the separated elastic film 34 is distorted by frictional force generated by sliding in chemical mechanical polishing. As action upon a silicon wafer by the pressure of air is uneven by flow stress, the uniformity of polished quantity is deteriorated.

Based upon the above examination, the inventors consider as follows: The uniformity of polished quantity by chemical mechanical polishing is substantially controlled by mechanical force pressed by the pressure plate 32, that is, pressure. In a state in which the elastic film 34 is in contact with the pressure plate 32, action by the pressure of air 27 compensates the change of the control of the uniformity of polished quantity by mechanical force pressed by the pressure plate 32, that is, pressure. However, in a state in which the elastic film 34 is completely separated from the pressure plate 32, action by the pressure of air 27 does not compensate the change of the control of the uniformity of polished quantity by mechanical force pressed by the pressure plate 32, that is, pressure.

The reason why a precision of 0.1 μm or less cannot be secured for the uniformity of polished quantity according to the prior art in which a patterned wafer is mechanochemically polished by an elastic body in which the above pressure fluid is sealed is based upon the above consideration as follows: A state in which the elastic body in which pressure fluid is sealed presses a patterned wafer is the same as a state in which the elastic film 34 is separated from the pressure plate 32 and presses a wafer. Therefore, the elastic body is distorted by frictional force generated by sliding in chemical mechanical polishing. As the flow stress of this elastic body changes uniform action by pressure sealed in the elastic body to uneven action, the uniformity of polished quantity is deteriorated.

Figure 6A:
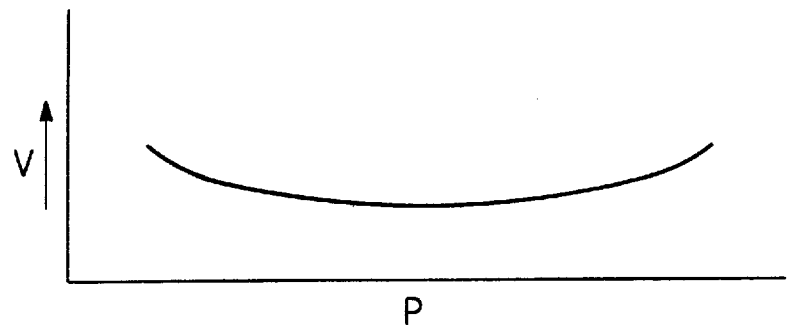
Figure 6B:
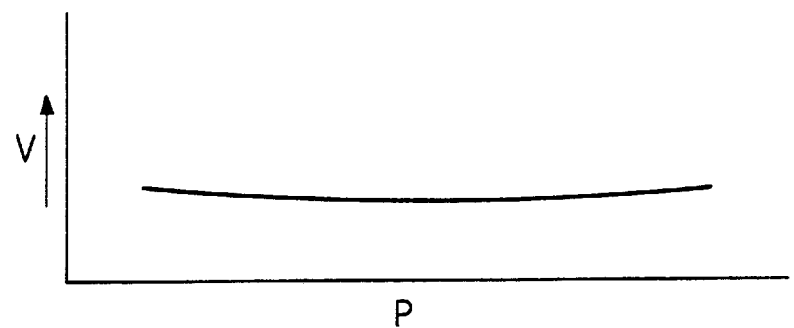
Figure 6C:
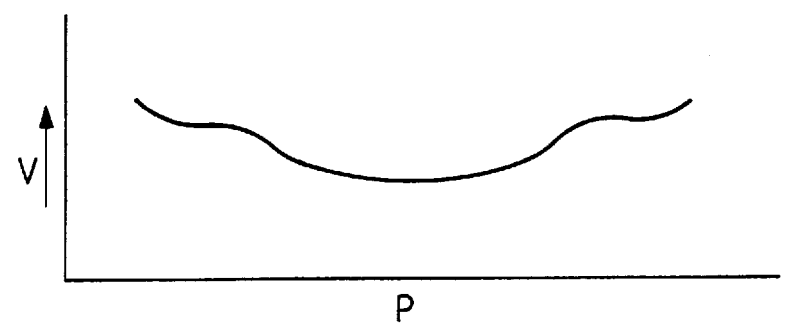

FIGS. 6A to 6C are graphs showing the distribution of polishing speed in the direction of the diameter of a silicon wafer. In FIGS. 6A to 6C, a horizontal axis shows the position P of a silicon wafer and a vertical axis shows polishing speed V. FIG. 6A shows a graph in a case where chemical mechanical polishing is performed under the condition of the pressure ratio S shown by a in FIG. 5. FIG. 6B shows a graph in a case where chemical mechanical polishing is performed under the condition of the pressure ratio S shown by b in FIG. 5. FIG. 6C shows a graph in a case where chemical mechanical polishing is performed under the condition of the pressure ratio S shown by c in FIG. 5.

FIG. 6A shows that a silicon oxide film is polished more quickly in the periphery of a wafer than in the center. FIG. 6B shows that a silicon oxide film is uniformly polished overall from the center of a wafer to the periphery. FIG. 6C shows that a silicon oxide film is more slowly polished in the center of a wafer than in the periphery and that the distribution is complicated. As a result, when chemical mechanical polishing is performed under the condition of pressure ratio S=1, the distribution of polishing speed is uniform overall.

According to the method of manufacturing a semiconductor device according to this embodiment, as the overall insulating film in the upper layer which is the polished surface can be uniformly and in addition, precisely uniformly flattened when irregularities on the surface of an insulating film in the upper layer formed by wiring in the lower layer are flattened by chemical mechanical polishing, the shortage of polishing or the excess of polishing can be prevented from being caused locally. As a result, minute multilayer wiring in high density of a semiconductor device can be realized.

(2) Second Embodiment

Next, a method of manufacturing a semiconductor device equivalent to a second embodiment according to the present invention will be described based upon a case in which Shallow Trench Isolation (hereinafter called STI), that is, Shallow Groove Isolation (hereinafter called SGI) is applied, referring to FIGS. 7A to 7G.

Figure 7A:
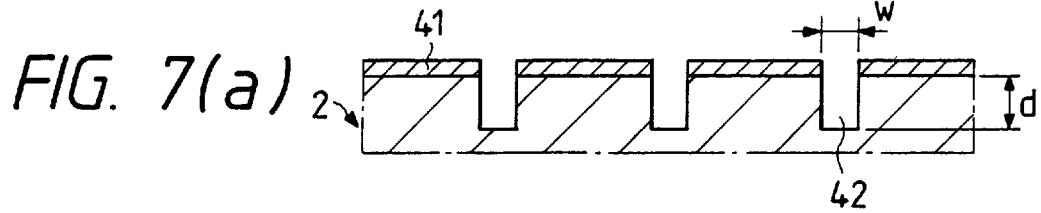

When SGI is executed, a device isolation groove 42 is formed on the surface of a substrate 2 by dry etching utilizing a mask 41 formed by patterning a $Si_3N_4$ film as shown in FIG. 7A. The depth d of the device isolation groove 42 is extremely shallow and approximately 0.2 to 0.3 μm.

Figure 7B:
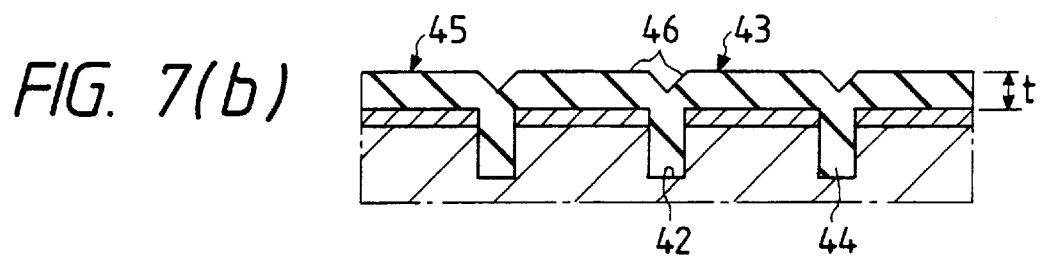

Next, as shown in FIG. 7B, an insulating film 43 constituted by a $SiO_2$ film is uniformly deposited on the overall substrate 2 by CVD. A part of the insulating film 43 forms a part 44 filled with insulating material by filling the device isolation groove 42 with it. A concave portion corresponding to the depth of the device isolation groove 42 is formed on the surface of the insulating film 43 by the part 44 filled with insulating material being formed. As a result, a large number of irregularities 46 are formed on the surface 45 of the insulating film 43. A wafer in this state is supplied to a patterned wafer polishing machine 10 for executing a device isolation part formation process in a method of manufacturing a semiconductor device equivalent to this embodiment as a wafer 1.

Figure 7C:
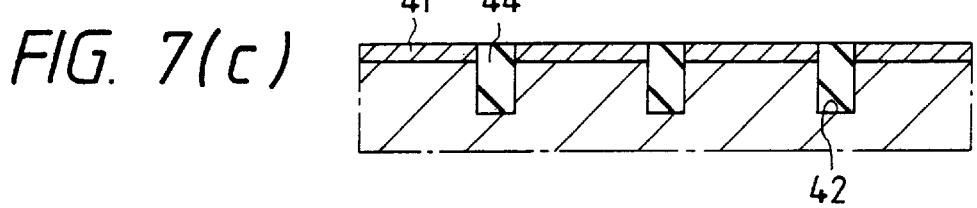

As in the case described in relation to FIG. 4, the surface 45 of the insulating film 43 (hereinafter called the polished surface) of a wafer 1 supplied to the patterned wafer polishing machine 10 is polished by chemical mechanical polishing. That is, the polished surface 45 of the wafer 1 is rubbed by an abrasive surface 15 and mechanochemically polished with the polished surface simultaneously pressed upon the abrasive surface 15 of a polishing pad 14 by mechanical force by the pressure plate 32 and action by the pressure of air 27. As the polished surface 45 is rubbed by the abrasive surface 15 with the polished surface simultaneously pressed upon the abrasive surface 15 by mechanical force by the pressure plate 32 and action by the pressure of air 27, the quantity of the polished surface 45 polished by the abrasive surface 15 is uniform overall as shown in FIG. 1. That is, the surface of the insulating film 43 constituting the polished surface 45 is uniformly polished overall. As a result, as shown in FIG. 7C, the surface of the mask 41 in the lower layer than the insulating film 43 is uniformly exposed on the overall surface of the substrate 2.

Figure 7D:
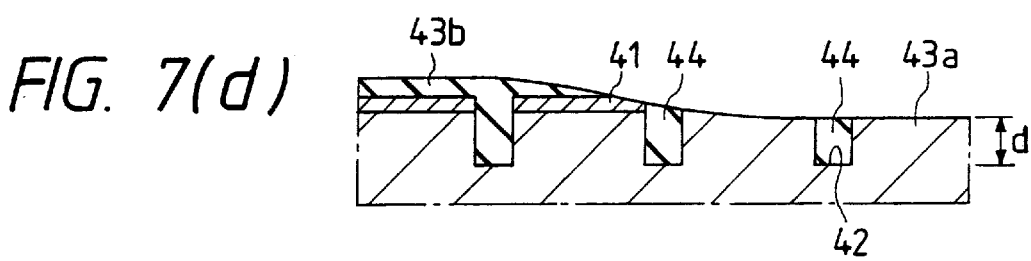

If the polished surface 45 of the insulating film 43 is unevenly mechanochemically polished, the substrate 2 is in a state in which a polishing excessive part 43a in which polishing is performed to the surface of the substrate 2 and a polishing short part 43b in which the insulating film 43 is left on the mask 41 respectively as shown in FIG. 7D partly and irregularly exist. As the depth d of the device isolation groove 42 is shallow in the polishing excessive part 43a, the characteristics of isolating a device in the polishing excessive part 43a are deteriorated. In the meantime, as the insulating film 43 in the polishing short part 43b prevents the mask 41 from being removed by dry etching in the next mask removing process, a part in which the mask 41 is left locally exists on the surface of the substrate 2. That is, if the polishing short part 43b exists, the mask 41 cannot be completely removed by dry etching.

Figure 7E:
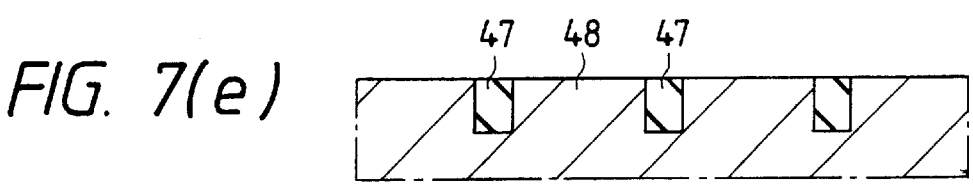

The mask 41 exposed on the surface of the substrate 2 is removed by dry etching. As the mask 41 on which the insulating film 43 is removed by chemical mechanical polishing is uniformed exposed overall when the mask 41 is removed by dry etching, the mask 41 can be completely and uniformly removed overall as shown in FIG. 7E. A device isolation part 47 is formed in the superficial part of the substrate 2 by the insulating material filled part 44 after the mask 41 is removed and a device forming part 48 is formed by a part surrounded by the device isolation parts 47.

Figure 7F:
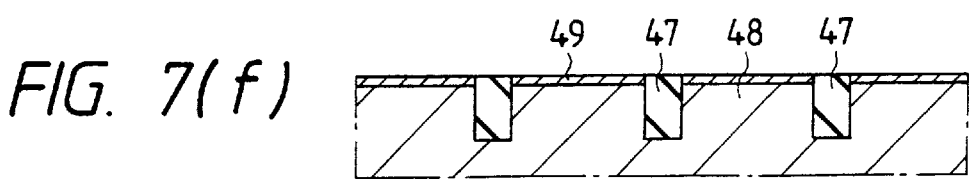

Afterward, an extremely thin gate oxide film 49 is formed on the surface of the device forming part 48 surrounded by the device isolation parts 47 in the superficial part of the substrate 2 by thermal oxidation as shown in FIG. 7F. If the mask 41 is left on the surface of the substrate 2 when the gate oxide film 49 is formed, the precision of the thickness of the gate oxide film 49 is deteriorated. However, when the mask 41 is completely removed, the gate oxide film 49 is formed so that the thickness is uniform and precise overall. As the surface of the device forming part 48 is extremely uniformly flattened, the thickness of the gate oxide film 49 is uniform and precise overall.

Figure 7G:
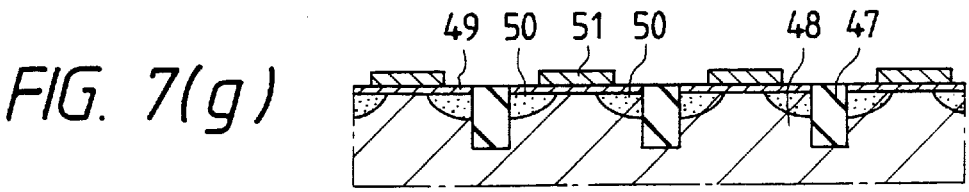

Next, as shown in FIG. 7G, an impurities diffused layer 50 is formed under the gate oxide film 49 in the device forming part 48 by ion implantation and a gate electrode 51 is formed on the gate oxide film 49. At this time, as the surface of the substrate 2 is extremely uniformly flattened, the impurities diffused layer 50 and the gate electrode 51 are uniformly and precisely formed on the overall surface of the substrate 2.

According to the method of manufacturing a semiconductor device equivalent to the above second embodiment, as the overall superficial part of the insulating film for constituting the device isolation part can be completely removed precisely uniformly when the device isolation part by SGI is formed by chemical mechanical polishing, shortage or excessiveness in polishing the insulating film can be prevented from being caused locally. As a result, the precision of the device isolation part by SGI, the gate oxide film, the impurities diffused layer and the gate electrode can be enhanced and in addition, the downsizing and densification of a semiconductor device can be further promoted.

When the polished surface 45 of the insulating film 43 of a sample the width w of the device isolation groove 42 of which is 0.25 $\mu$m, the depth d of the device isolation groove of which is 0.35 $\mu$m and the thickness of the insulating film 43 of which is 0.5 $\mu$m is mechanochemically polished by the patterned wafer polishing machine 10 constituted as described above by 0.15 $\mu$m, a deviation of polished quantity on the overall insulating film 43 except a part as far as 3 mm from the periphery of the sample is ±20 nm or less. That is, it is verified that the extremely satisfactory result of the uniformity of polished quantity can be obtained.

Figure 8:
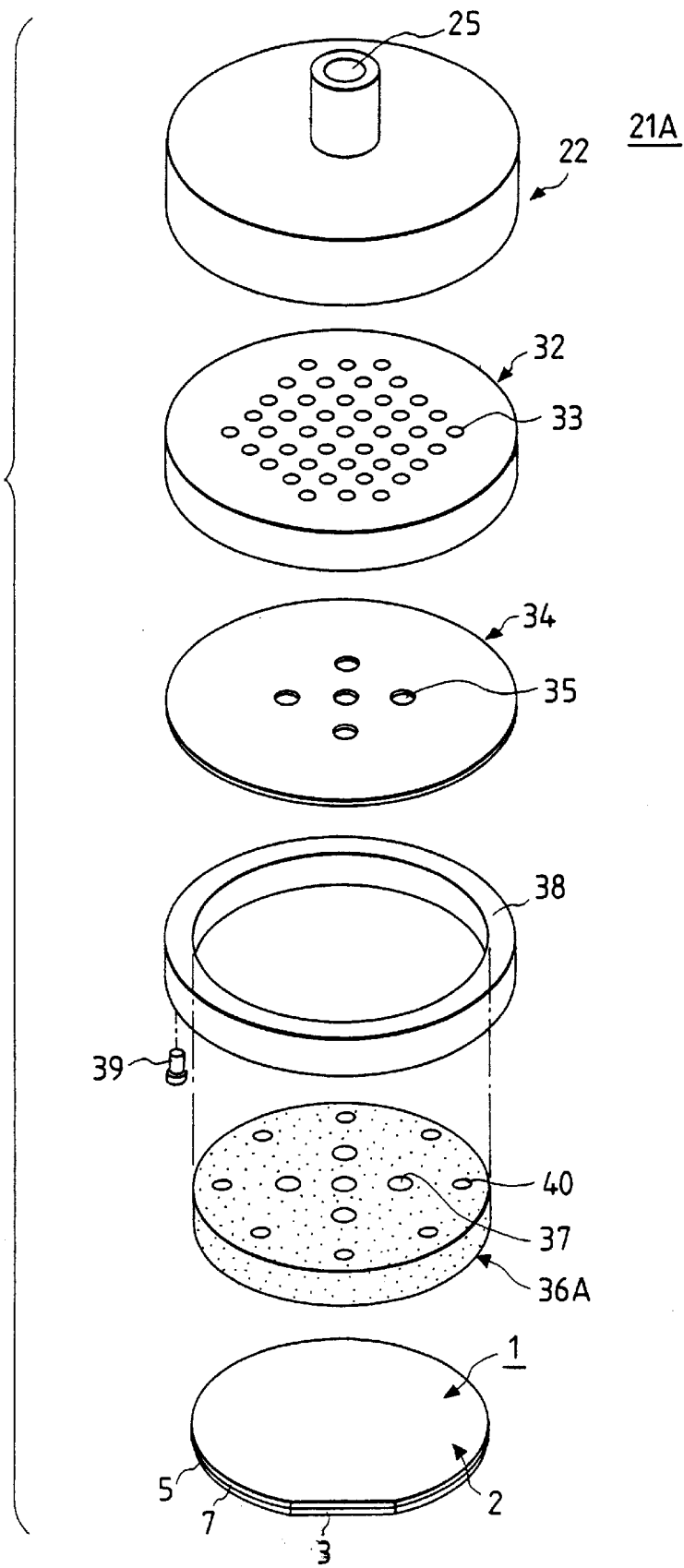
FIG. 8 is an exploded perspective drawing showing a head of a patterned wafer polishing machine of the second embodiment.
Figure 9A:
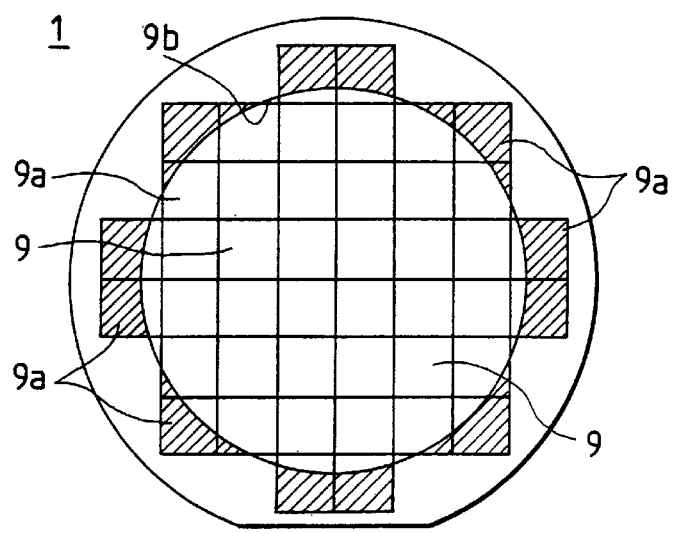
Figure 9B:
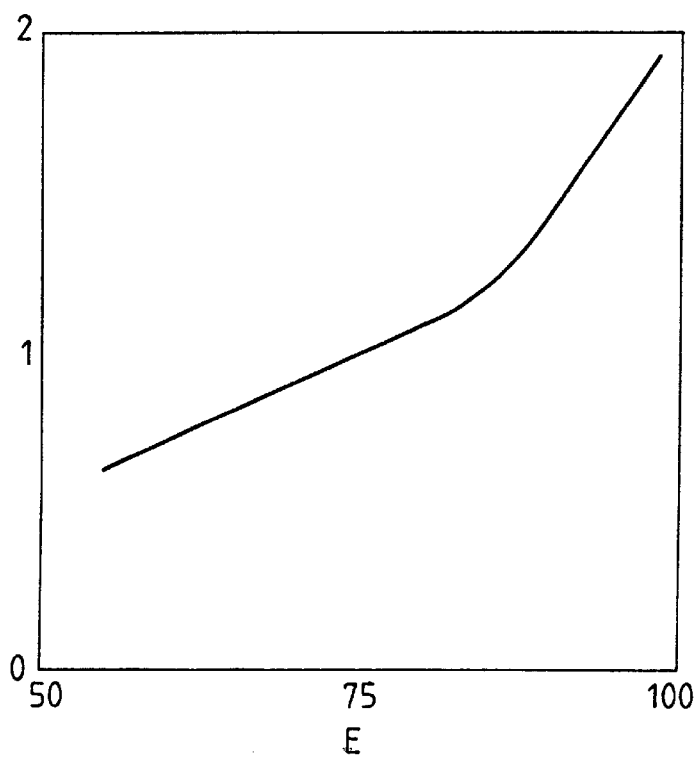

FIG. 8 is an exploded perspective drawing in which a part is omitted of a head showing a second embodiment of a patterned wafer polishing machine. FIGS. 9A and 9B are explanatory drawings for explaining the action.

The head 21A shown in FIG. 8 is different from the head 21 shown in FIGS. 1 and 2 in that a backing pad 36A (hereinafter called a polishing speed distribution control pad) for preventing polishing speed in the periphery of a wafer 1 from being increased is used. That is, in the periphery of the polishing speed distribution control pad 36A, plural adjusting holes 40 for partly adjusting a mean compression elastic modulus E are provided. The mean compression elastic modulus E in the periphery of the polishing speed distribution control pad 36A is deteriorated more than that in the center by the rate in which the adjusting hole 40 is provided. The mean compression elastic modulus E in the periphery of the polishing speed distribution control pad 36A can be arbitrarily adjusted depending upon the size of the adjusting hole 40 and an interval between the adjusting holes.

Next, the action of the polishing speed distribution control pad 36A will be described, referring to FIGS. 9A and 9B. As sliding speed in the periphery of a wafer is faster than that in the center if the wafer rotates on its axis in the patterned wafer polishing machine, polishing speed on the polished surface is quickened in the periphery. FIG. 9A shows the arrangement of the pellets 9 of a patterned wafer 1. As shown in FIG. 9A, as pellets 9a shown by diagonal lines in the periphery partly belong to a peripheral area 9b in which polishing speed is quickened, polished quantity in such a pellet 9a is uneven. As a result, the patterning of such a pellet 9a in the periphery is incomplete and such pellets 9a in the periphery are defective. It is also the same in the above patterned wafer polishing machine 10 that the polishing speed in the periphery of the polished surface is quickened. This can be also understood from a graph showing the distribution of polishing speed in FIG. 6B.

In the second embodiment, as the polishing speed distribution control pad 36A shown in FIG. 8 is used in place of the backing pad 36 shown in FIGS. 1 and 2, a phenomenon in which polishing speed is quickened in the periphery of the polished surface is prevented. As the mean compression elastic modulus E in the periphery of the polishing speed distribution control pad 36A is deteriorated by providing adjusting holes 40, the elasticity in the periphery of the polishing speed distribution control pad 36A for a wafer 1 is weakened. As the elasticity of the polishing speed distribution control pad 36A by which the periphery of the polished surface 7 is pressed upon the abrasive surface 15 is weakened by the rate in which the elasticity of the polishing speed distribution control pad 36A is weakened, polishing speed at which the polished surface 7 is mechanochemically polished by the abrasive surface 15 is controlled. As a result, as the polished quantity of each pellet 9a in the periphery shown in FIG. 9A is uniform, the patterning of pellets 9a in the periphery is complete and the pellets 9a in the periphery are nondefective. That is, the yield in manufacturing per wafer is enhanced and the effective number of obtained pellets is increased.

FIG. 9B is a graph showing effect which the mean compression elastic modulus in the periphery of the polishing speed distribution control pad has upon the uniformity of polishing speed. This graph is obtained by gradually changing a mean compression elastic modulus by changing the number of the open adjusting holes 40 with the diameter of 1 mm in the range far by 5 mm from the periphery of the polishing speed distribution control pad 36A with the diameter of 8 inches. As shown in FIG. 9B, a horizontal axis shows a mean compression elastic modulus E. The mean compression elastic modulus E is expressed by the percentage of the mean compression elastic modulus in the periphery to the initial elastic modulus of the polishing speed distribution control pad. A vertical axis shows the uniformity r of polishing speed. The uniformity r of polishing speed is expressed by the ratio of mean polishing speed in the periphery to that in the center on the polished surface.

The following is proven from FIG. 9B: The uniformity r of polishing speed in the periphery of the polished surface can be minimized by setting the mean compression elastic modulus E in the periphery of the polishing speed distribution control pad to approximately 75% of the initial elastic modulus. The optimum value of the mean compression elastic modulus E in the periphery of the polishing speed distribution control pad is varied depending upon the conditions of chemical mechanical polishing such as the size and thickness of a wafer, the property and hardness of a polished surface, mechanical pressure and air pressure. The mean compression elastic modulus E of the polishing speed distribution control pad is not only adjusted by providing adjusting holes through the polishing speed distribution control pad but can be adjusted by a method of removing the periphery of the polishing speed distribution control pad or by a method of slitting the periphery and others.

(3) Third Embodiment

Figure 10:
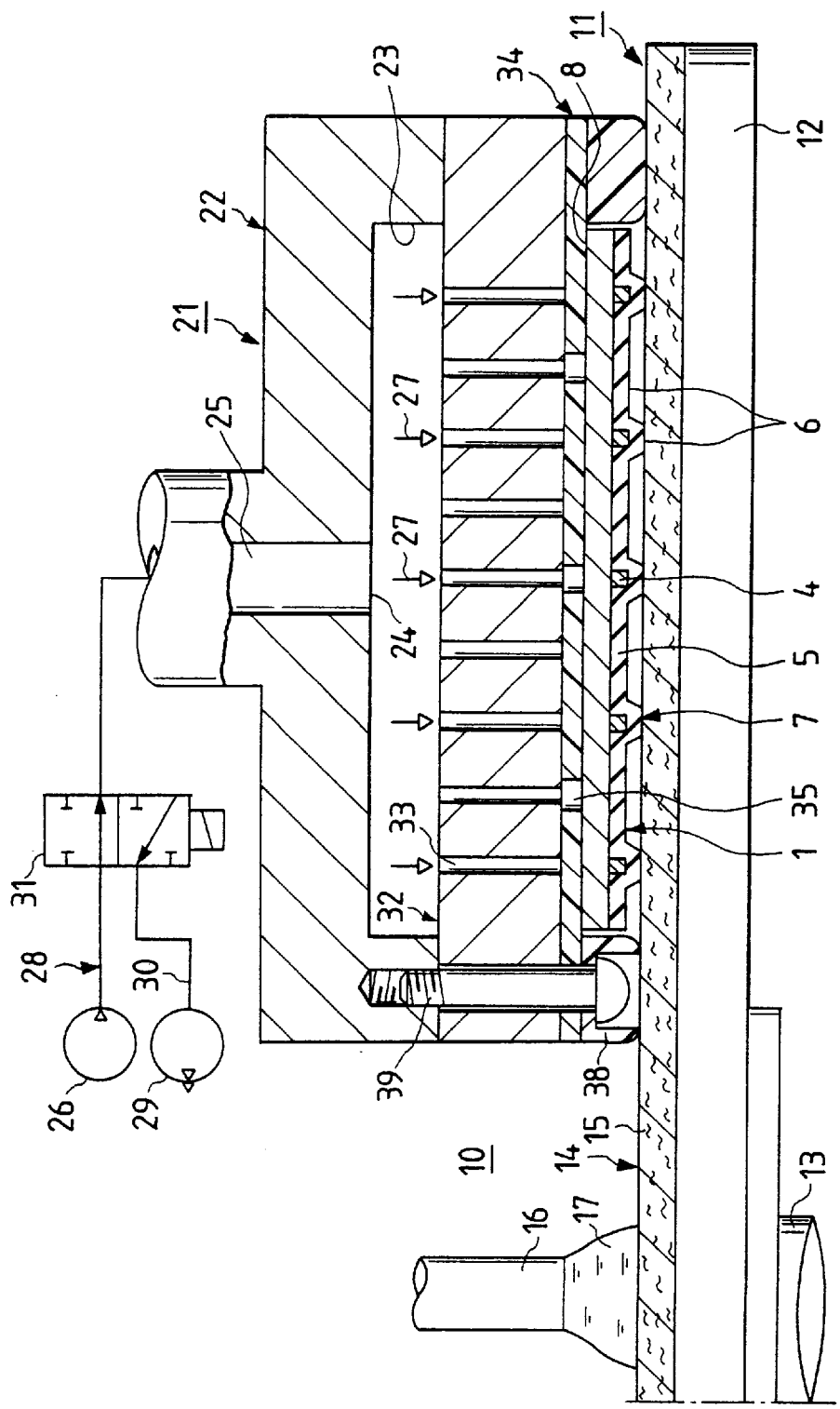
FIG. 10 is a front sectional view showing a third embodiment of a patterned wafer polishing machine according to the present invention.

FIG. 10 is a front view, a part of which is shown in section, and in which a part is omitted, showing a third embodiment of a patterned wafer polishing machine.

The third embodiment is different from the above first embodiment in that a backing pad is omitted. A wafer 1 is mechanically pressed by a pressure plate 32 and pressed by action by air pressure applied to an elastic film 34 with the wafer directly in contact with the elastic film 34. Therefore, the polished surface of the wafer 1 is uniformly mechanochemically polished overall by the same action as in the above first embodiment.

Figure 11:
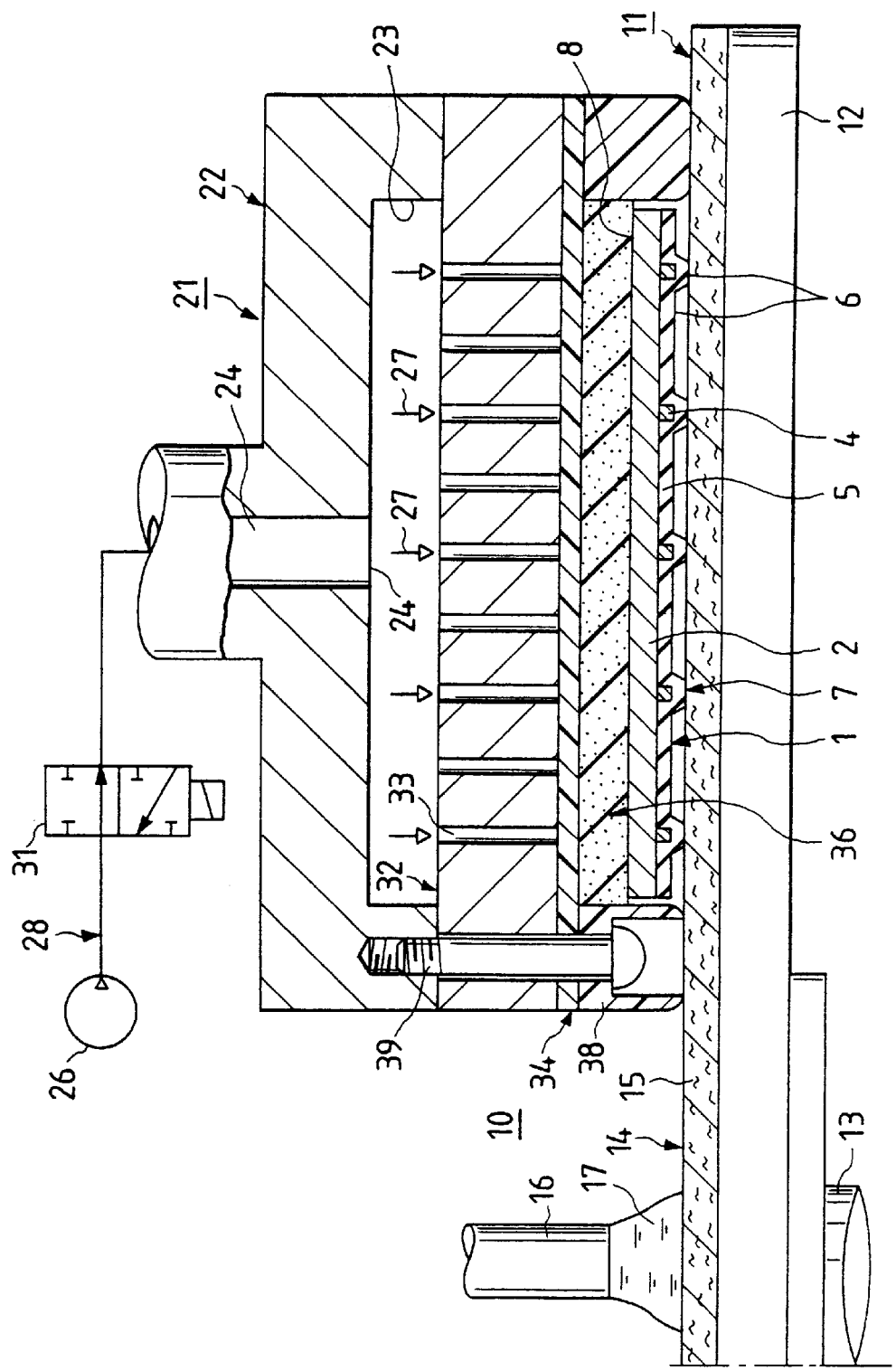
FIG. 11 is a front sectional view showing a fourth embodiment of a patterned wafer polishing machine according to the present invention.

FIG. 11 is a front view, a part of which is shown in section, in which a part is omitted, showing a fourth embodiment of a patterned wafer polishing machine.

(4) Fourth Embodiment

The fourth embodiment is different from the above first embodiment in that a through hole through an elastic film for vacuum attracting and a through hole through a backing pad are omitted and a negative pressure supply passage is omitted. As the omitted components are used for the vacuum attracting and holding of a wafer 1, they have no effect upon the enhancement of the uniformity on a polished surface in chemical mechanical polishing. Therefore, the same action and effect as in the above first embodiment can be produced.

(5) Fifth Embodiment

The above method of manufacturing a semiconductor integrated circuit device according to the present invention can be also achieved by chemical mechanical polishing constituted as shown in FIG. 12.

As shown in FIG. 12, a polishing pad 122 is spread on a lower rotating base 121 and the component side of a wafer 123 is opposed to the polishing pad. A pressure partition 125 is provided on the wafer via a backing sheet 124 made of softer material than a silicon wafer which is thinner than the wafer. A pressure limiting plate 126 for limiting mechanical pressure only in the center is arranged on the partition or a diaphragm 125. A porous pressure plate 127 (may be a porous plate and may be also made of general material partly provided with a gas inlet) for actually applying mechanical pressure and gas pressure is provided on the pressure limiting plate, the pressure plate 127 is held by the side frame 129 of a wafer attracting head 130, pressurized gas is supplied to the back of the pressure plate from the gas inlet 128 and negative pressure for the vacuum attracting of a wafer is applied.

According to this system, the internal area is completely or partly pressed mechanically and uniform polishing on an overall wafer can be realized because the readily polished periphery is polished only by gas pressure.

The pressure limiting plate 126 is not necessarily required and in case no pressure limiting plate is provided, as both mechanical pressure and gas pressure operate on the center, in addition a self-correcting function by gas pressure operates and the effect of adjusting pressure so that the irregularities of a wafer are flattened of themselves is added, a very satisfactory result can be obtained.

(6) Sixth Embodiment

Figure 13A:
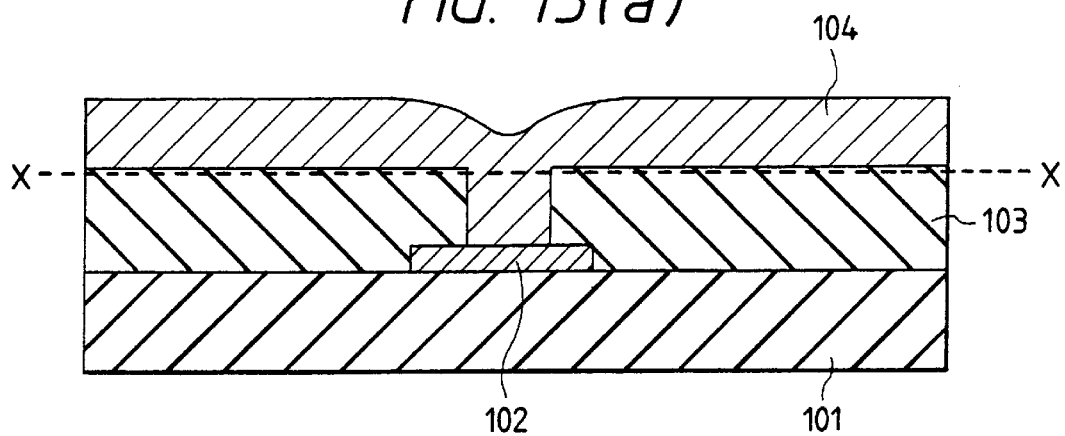
FIGS. 13A and 13B are sectional views showing a metallic plug integrated circuit process in a sixth embodiment according to the present invention.
Figure 13B:
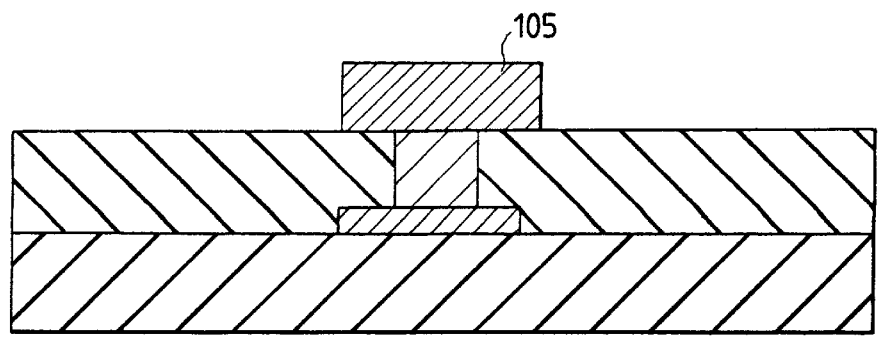

The above-mentioned invention is also applied to flattening a semiconductor integrated circuit using a tungsten plug (W plug) shown in a process flow diagram in FIGS. 13A and 13B.

As shown in FIG. 13A, wiring 102 in a lower layer is formed on a silicon oxide film and others 101 on a silicon wafer and an interlayer insulating film 103 is deposited on the wiring. Afterward, a through hole is formed and metal 104 such as tungsten is deposited on the overall surface so that the metal is embedded in the through hole. Afterward, the surface is polished and removed to a broken line X—X by chemical mechanical polishing and as shown in FIG. 13B, only a plug is left. Next, wiring 105 in an upper layer is patterned.

(7) Seventh Embodiment

Figure 14A:
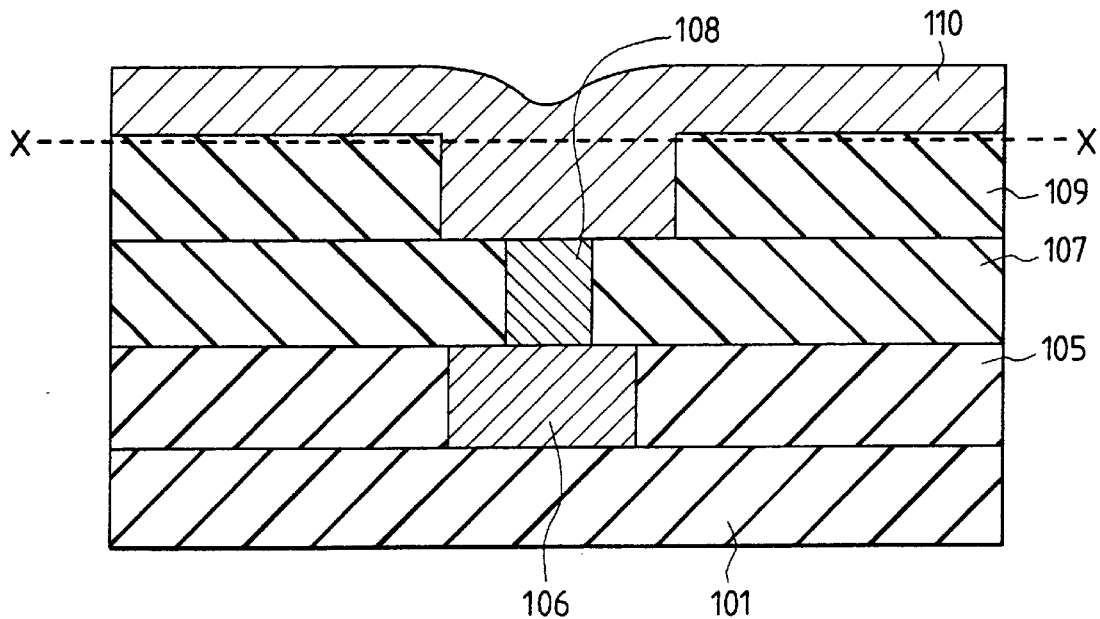
FIGS. 14A and 14B are sectional views showing Damascene integrated circuit process in a seventh embodiment according to the present invention.
Figure 14B:
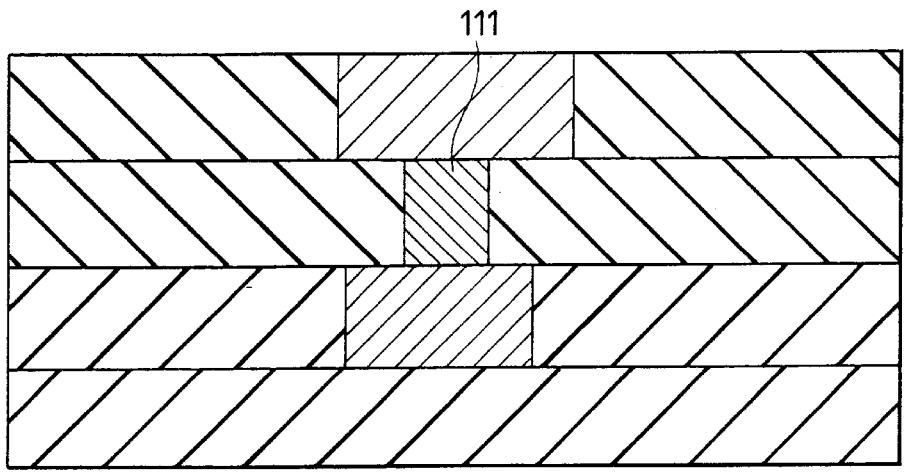

The above-mentioned invention is also applied to flattening a semiconductor integrated circuit using a Damascene process shown in a process flow diagram in FIGS. 14A and 14B.

As shown in FIG. 14A, embedded wiring 106 made of copper and others in a lower layer and a first interlayer insulating film 105 are formed on a silicon oxide film and others 101 on a silicon wafer and a second interlayer insulating film 107 is deposited on them. Afterward, a through hole is formed and metal 104 is deposited overall so that the metal is embedded in the through hole. Afterward, a plug 108 is formed by chemical mechanical polishing. Further, a third interlayer insulating film 109 is deposited, a concave pattern for embedded wiring is formed and wiring material 110 such as copper for an upper layer is deposited overall. Chemical mechanical polishing is applied to the wiring, as shown in FIG. 14B, the surface is polished and removed to a broken line X—X and the embedded wiring 111 in the upper layer is formed.

(8) Eighth Embodiment

Figure 15A:
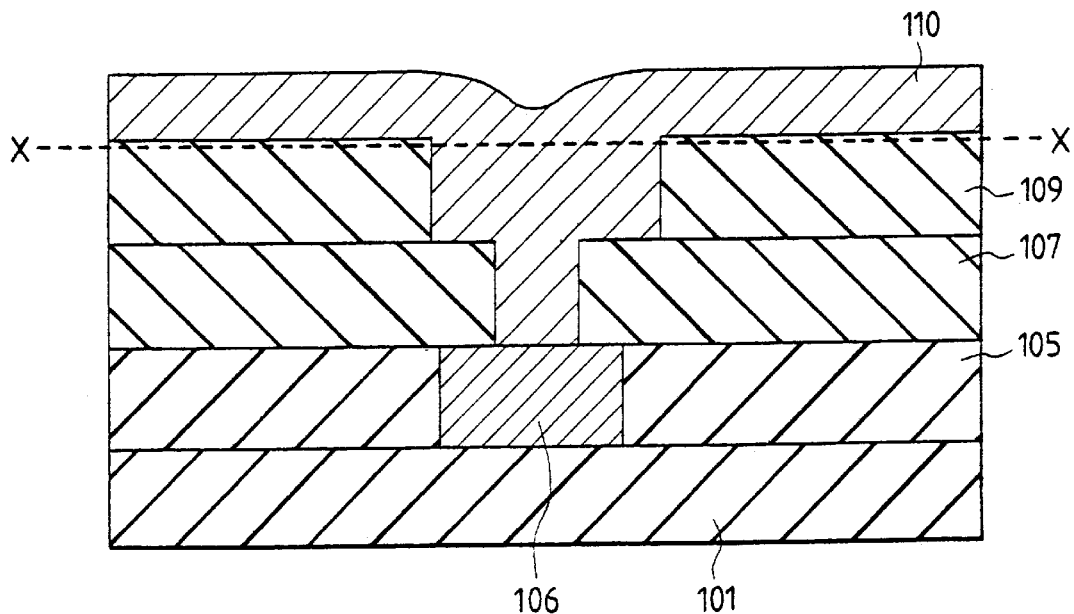
FIGS. 15A and 15B are sectional views showing a Dual Damascene integrated circuit process in an eighth embodiment according to the present invention.
Figure 15B:
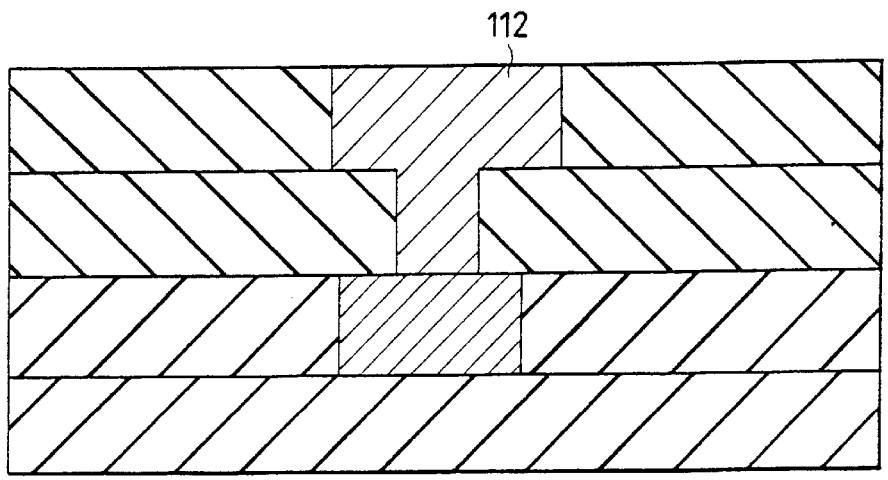

The above-mentioned invention is also applied to flattening a semiconductor integrated circuit using a Dual Damascene process shown in a process flow diagram in FIG. 15A and 15B.

As shown in FIG. 15A, embedded wiring 106 made of copper and others in a lower layer and a first interlayer insulating film 105 are formed on a silicon oxide film and others 101 on a silicon wafer and a second interlayer insulating film 107 is deposited on them. Afterward, a through hole is formed and metal 104 is deposited overall so that the metal is embedded in the through hole. Further, a third interlayer insulating film 109 is deposited, a concave pattern for embedded wiring is formed and wiring material 110 such as copper for an upper layer is deposited overall including a plug formation part. Chemical mechanical polishing is applied to the wiring, as shown in FIG. 15B, the surface is polished and removed to a broken line X—X and the embedded wiring 112 in the upper layer is formed.

The invention made by the inventors is described above based upon the embodiments. However, the present invention is not limited to the above embodiments and variations are also within the scope of the invention.

Plural vents may be provided to a pressure plate or one vent may be provided. As a vent has only to connect the upper and lower space of a pressure plate, a vent can be also constituted by forming the pressure plate by a porous rigid plate.

Means for fixing the pressure plate and an elastic film to a head body is not limited to fastening means and adhesive means and others may be also used.

Gas for pressing a wafer via the elastic film is not limited to air and gas such as nitrogen may be also used.

Not only a head is arranged on the upper side and a polishing tool is arranged on the lower side but the head may be arranged on the lower side and the polishing tool may be arranged on the upper side. Not only the head is lowered but the polishing tool may be also lifted. Further, the head and the polishing tool are fixed and the polished surface of a wafer and the abrasive surface of the polishing tool may be rubbed, being moved relatively horizontally.

Not only the backing pad is formed by rubber, resin or foam resin but it can be formed by suitable elastic material such as felt and glass wool.

The brief description of the effect obtained by a typical one of the inventions disclosed in this patent application is as follows:

As the polished surface of a wafer can be uniformly and precisely polished mechanochemically overall by correcting force pressing the wafer, that is, pressure based upon irregular and complicated distortion operating upon the wafer in chemical mechanical polishing, precise patterning can be secured. As a result, a method of manufacturing an ultra-minute semiconductor device with a high degree of integration can be provided.

What is claimed is:

1. A method of manufacturing a semiconductor integrated circuit device, comprising the steps of:
   (a) forming a first film over a patterned major surface of a wafer; and
   (b) planarizing the patterned major surface where the first film has been formed, by relatively displacing the wafer with respect to a polishing plane in a plane parallel with the patterned major surface, while pressing the patterned major surface of the wafer against the polishing plane by exerting both static gas pressure through a diaphragm and mechanical pressure through a pressure plate disposed over the diaphragm, to an opposite major surface of the wafer.

2. A method of manufacturing a semiconductor integrated circuit device according to claim 1, wherein the ratio of the gas pressure to the mechanical pressure upon said wafer by the pressure plate is set to 0.5 to 1.5.

3. A method of manufacturing a semiconductor integrated circuit device according to claim 2, wherein a backing pad softer than the wafer is provided between said diaphragm and the opposite major surface of the wafer.

4. A method of manufacturing a semiconductor integrated circuit device according to claim 3, wherein a through-hole for holding the wafer by vacuum attraction is formed through the diaphragm.

5. A method of manufacturing a semiconductor integrated circuit device according to claim 4, wherein a part to which mixed pressure, including said mechanical pressure and gas pressure, is applied is substantially over the entire opposite surface of the wafer.

6. A method of manufacturing a semiconductor integrated circuit device, comprising the steps of:
   (a) forming a first wiring pattern over a patterned major surface of a wafer;
   (b) forming a first insulating film over the patterned major surface where the first wiring pattern has been formed;
   (c) planarizing the patterned major surface where the first wiring pattern and the first insulating film have been formed, by relatively displacing the wafer with respect to a polishing plane in a plane parallel with the patterned major surface, while pressing the patterned major surface of the wafer against the polishing plane by exerting both static gas pressure through a diaphragm and mechanical pressure through a pressure plate disposed over the diaphragm, to an opposite major surface of the wafer;
   (d) forming through-holes in the planarized first insulating film; and
   (e) forming a second wiring pattern over the patterned major surface where the through-holes have been formed.

7. A method of manufacturing a semiconductor integrated circuit device according to claim 6, wherein the ratio of the gas pressure to the mechanical pressure upon said wafer by the pressure plate is set to 0.5 to 1.5.

8. A method of manufacturing a semiconductor integrated circuit device according to claim 7, wherein a backing pad softer than the wafer is provided between said diaphragm and the other opposite surface wafer.

9. A method of manufacturing a semiconductor integrated circuit device according to claim 8, wherein a through-hole for holding the wafer by vacuum attraction is formed through the diaphragm.

10. A method of manufacturing a semiconductor integrated circuit device according to claim 9, wherein a part to which mixed pressure, including said mechanical pressure and gas pressure, is applied is substantially over the entire opposite major surface of the wafer.

11. A method of manufacturing a semiconductor integrated circuit device, comprising the steps of:
   (a) forming a first insulating film over a patterned major surface of a wafer;
   (b) forming a first pattern of the first insulating film by selectively etching the first insulating film so as to form recess portions in the first insulating film;
   (c) forming a first conductive film over the patterned major surface where the first insulating has been patterned; and
   (d) planarizing the patterned major surface where the first conductive film and the first pattern have been formed to the extent that the first conductive film remains in the recess portions, by relatively displacing the wafer with respect to a polishing plane in a plane parallel with the patterned major surface, while pressing the patterned major surface of the wafer against the polishing plane by exerting both static gas pressure through a diaphragm and mechanical pressure through a pressure plate disposed over the diaphragm, to an opposite major surface of the water.

12. A method of manufacturing a semiconductor integrated circuit device according to claim 11, wherein the ratio of the gas pressure to the mechanical pressure upon said wafer by the pressure plate is set to 0.5 to 1.5.

13. A method of manufacturing a semiconductor integrated circuit device according to claim 12, wherein a backing pad softer than the wafer is provided between said diaphragm and the opposite major surface of the wafer.

14. A method of manufacturing a semiconductor integrated circuit device according to claim 13, wherein a through-hole for holding the wafer by vacuum attraction is formed through the diaphragm.

15. A method of manufacturing a semiconductor integrated circuit device according to claim 14, wherein a part to which mixed pressure, including said mechanical pressure and gas pressure, is applied is substantially over the entire opposite major surface of the wafer.

16. A method of manufacturing a semiconductor integrated device, comprising the steps of:

(a) forming a first film over a patterned major surface of a wafer; and (b) planarizing the patterned major surface where the first film has been formed by relatively displacing the wafer with respect to a polishing plane in a plane parallel with the patterned major surface, while pressing the patterned major surface of the wafer against the polishing plane by exerting static gas pressure through a diaphragm to an opposite major surface of the wafer, with the diaphragm macroscopically contacting a pressure plate disposed over the diaphragm and to which pressure plate mechanical pressure is applied.

17. A method of manufacturing a semiconductor integrated circuit device according to claim 16, wherein the ratio of the gas pressure to the mechanical pressure upon said wafer by the pressure plate is set to 0.5 to 1.5.

18. A method of manufacturing a semiconductor integrated circuit device according to claim 17, wherein a backing pad softer than the wafer is provided between said diaphragm and the opposite major surface of the wafer.

19. A method of manufacturing a semiconductor integrated circuit device according to claim 18, wherein a through-hole for holding the wafer by vacuum attraction is formed through the diaphragm.

20. A method of manufacturing a semiconductor integrated circuit device according to claim 19, wherein a part to which mixed pressure, including said mechanical pressure and gas pressure, is applied is substantially over the entire opposite major surface of the wafer.

21. A method of manufacturing a semiconductor integrated circuit device, comprising the steps of:

(a) forming a first wiring pattern over a patterned major surface of a wafer;

(b) forming a first insulating film over the patterned major surface where the first wiring pattern has been formed;

(c) planarizing the patterned major surface where the first wiring pattern and the first insulating film have been formed, by relatively displacing the wafer with respect to a polishing plane in a plane parallel with the patterned major surface, while pressing the patterned major surface of the wafer against the polishing plane by exerting static gas pressure through a diaphragm to an opposite major surface of the wafer, with the diaphragm macroscopically contacting a pressure plate disposed over the diaphragm and to which pressure plate mechanical pressure is applied;

(d) forming through-holes in the planarized first insulating film; and (e) forming a second wiring pattern over the patterned major surface where the through-holes have been formed.

22. A method of manufacturing a semiconductor integrated circuit device according to claim 21, wherein the ratio of the gas pressure to the mechanical pressure upon said wafer by the pressure plate is set to 0.5 to 1.5.

23. A method of manufacturing a semiconductor integrated circuit device according to claim 22, wherein a backing pad softer than the wafer is provided between said diaphragm and the opposite major surface of the wafer.

24. A method of manufacturing a semiconductor integrated circuit device according to claim 23, wherein a through-hole for holding the wafer by vacuum attraction is formed through the diaphragm.

25. A method of manufacturing a semiconductor integrated circuit device according to claim 24, wherein a part to which mixed pressure, including said mechanical pressure and gas pressure, is applied is substantially over the entire opposite major surface of the wafer.

26. A method of manufacturing a semiconductor integrated circuit device, comprising the steps of:

(a) forming a first insulating film over a patterned major surface of a wafer;

(b) forming a first pattern of the first insulating film by selectively etching the first insulating film so as to form recess portions in the first insulating film;

(c) forming a first conductive film over the patterned major surface where the first insulating film has been patterned; and (d) planarizing the patterned major surface where the first conductive film and the first pattern have been formed to the extent that the first conductive film remains in the recess portions, by relatively displacing the wafer with respect to a polishing plane in a plane parallel with the patterned major surface, while pressing the patterned major surface of the wafer against the polishing plane by exerting static gas pressure through a diaphragm to an opposite major surface of the wafer, with the diaphragm macroscopically contacting a pressure plate disprosed over the diaphragm and to which pressure plate mechanical pressure is applied.

27. A method of manufacturing a semiconductor integrated circuit device according to claim 26, wherein the ratio of the gas pressure to be mechanical pressure upon said wafer by the pressure plate is set 0.5 to 1.5.

28. A method of manufacturing a semiconductor integrated circuit device according to claim 27, wherein a backing pad softer than the wafer is provided between said diaphragm and the opposite major surface of the wafer.

29. A method of manufacturing a semiconductor integrated circuit device according to claim 28, wherein a through-hole for holding the wafer by vacuum attraction is formed through the diaphragm.

30. A method of manufacturing a semiconductor integrated circuit device according to claim 29, wherein a part to which mixed pressure, including said mechanical pressure and gas pressure, is applied is substantially over the entire opposite major surface of the wafer.

* * * * *